(12) United States Patent
Yamamoto et al.

(10) Patent No.: US 10,873,483 B2
(45) Date of Patent: *Dec. 22, 2020

(54) SEMICONDUCTOR DEVICE AND MEMORY SYSTEM

(71) Applicant: TOSHIBA MEMORY CORPORATION, Tokyo (JP)

(72) Inventors: Kensuke Yamamoto, Kanagawa (JP); Kosuke Yanagidaira, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/590,191

(22) Filed: Oct. 1, 2019

(65) Prior Publication Data

US 2020/0036561 A1 Jan. 30, 2020

Related U.S. Application Data

(63) Continuation of application No. 15/683,898, filed on Aug. 23, 2017, now Pat. No. 10,454,721.

(30) Foreign Application Priority Data

Sep. 13, 2016 (JP) ................. 2016-178546

(51) Int. Cl.
| | | |
|---|---|---|
| *H04L 25/02* | (2006.01) | |
| *G11C 29/02* | (2006.01) | |
| *G11C 11/4093* | (2006.01) | |
| *G11C 7/10* | (2006.01) | |
| *G11C 11/16* | (2006.01) | |
| *G11C 11/409* | (2006.01) | |
| *H03K 19/00* | (2006.01) | |
| *H03K 19/17764* | (2020.01) | |

(52) U.S. Cl.
CPC ........ *H04L 25/0278* (2013.01); *G11C 7/1057* (2013.01); *G11C 11/1673* (2013.01); *G11C 11/409* (2013.01); *G11C 11/4093* (2013.01); *G11C 29/022* (2013.01); *G11C 29/028* (2013.01); *H03K 19/0005* (2013.01); *H03K 19/17764* (2013.01); *G11C 2207/105* (2013.01); *G11C 2207/2254* (2013.01)

(58) Field of Classification Search
None
See application file for complete search history.

(56) References Cited

U.S. PATENT DOCUMENTS

| | | | |
|---|---|---|---|
| 7,514,954 | B2 | 4/2009 | Kim et al. |
| 7,528,626 | B2 | 5/2009 | Kim |
| 7,898,290 | B2 | 3/2011 | Kim |
| 2011/0242916 | A1 | 10/2011 | Seol et al. |
| 2012/0099383 | A1 | 4/2012 | Kim et al. |

(Continued)

*Primary Examiner* — Seokjin Kim
(74) *Attorney, Agent, or Firm* — Kim & Stewart LLP

(57) ABSTRACT

A semiconductor device includes a first chip and a second chip. The first chip includes a first circuit having a first output terminal. The second chip includes a second circuit having a second output terminal, which is electrically connected to the first output terminal via a first signal line. When the first chip and the second chip receive a first command, the second circuit calibrates an output impedance at the second output terminal through a first calibration operation based on an output impedance at the first output terminal.

18 Claims, 16 Drawing Sheets

(56) References Cited

U.S. PATENT DOCUMENTS

| | | | |
|---|---|---|---|
| 2014/0185384 A1* | 7/2014 | Kim | G11C 7/04 |
| | | | 365/185.17 |
| 2015/0067292 A1* | 3/2015 | Grunzke | G06F 13/1694 |
| | | | 711/170 |
| 2016/0204782 A1* | 7/2016 | Lee | H03K 19/017545 |
| | | | 365/189.17 |
| 2018/0053556 A1 | 2/2018 | Yanagidaira | |
| 2018/0062651 A1* | 3/2018 | Jung | H03K 19/017509 |
| 2018/0075885 A1* | 3/2018 | Jung | G11C 29/50008 |

* cited by examiner

FIG. 11

|       | SEMICONDUCTOR STORAGE DEVICE 20 | SEMICONDUCTOR STORAGE DEVICE 30 | SEMICONDUCTOR STORAGE DEVICE 40 | SEMICONDUCTOR STORAGE DEVICE 50 |
|-------|---|---|---|---|
| DQ<0> | ○ |   |   |   |
| DQ<1> |   | ○ |   |   |
| DQ<2> |   |   | ○ |   |
| DQ<3> |   |   |   | ○ |
| DQ<4> |   |   |   |   |
| DQ<5> |   |   |   |   |
| DQ<6> |   |   |   |   |
| DQ<7> |   |   |   |   |

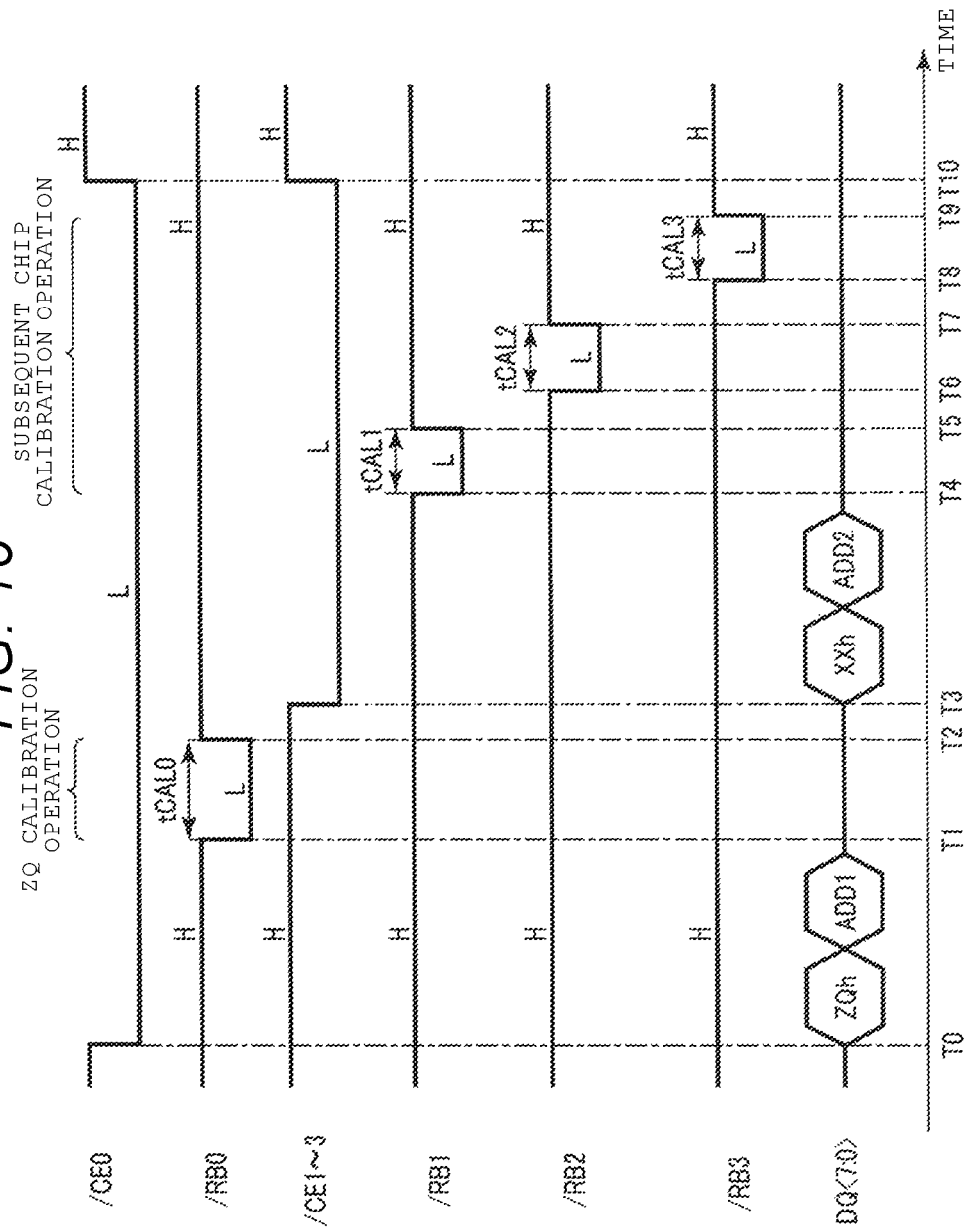

SEMICONDUCTOR DEVICE AND MEMORY SYSTEM

CROSS-REFERENCE TO RELATED APPLICATION(S)

This application is a continuation of U.S. patent application Ser. No. 15/683,898, filed Aug. 23, 2017, which application is based upon and claims the benefit of priority from Japanese Patent Application No. 2016-178546, filed Sep. 13, 2016, the entire contents of which are incorporated herein by reference.

FIELD

Embodiments described herein relate generally to a semiconductor device and a memory system.

BACKGROUND

A memory system that includes NAND flash memory as a semiconductor device and a controller which controls the NAND flash memory has been known.

DESCRIPTION OF THE DRAWINGS

FIG. 11 is a table that illustrates the subsequent chip calibration operation of the semiconductor device, according to the first embodiment.

FIG. 16 is a timing chart for describing a ZQ calibration operation and a subsequent chip calibration operation of a semiconductor device, according to a modification example.

DETAILED DESCRIPTION

Figure 1:
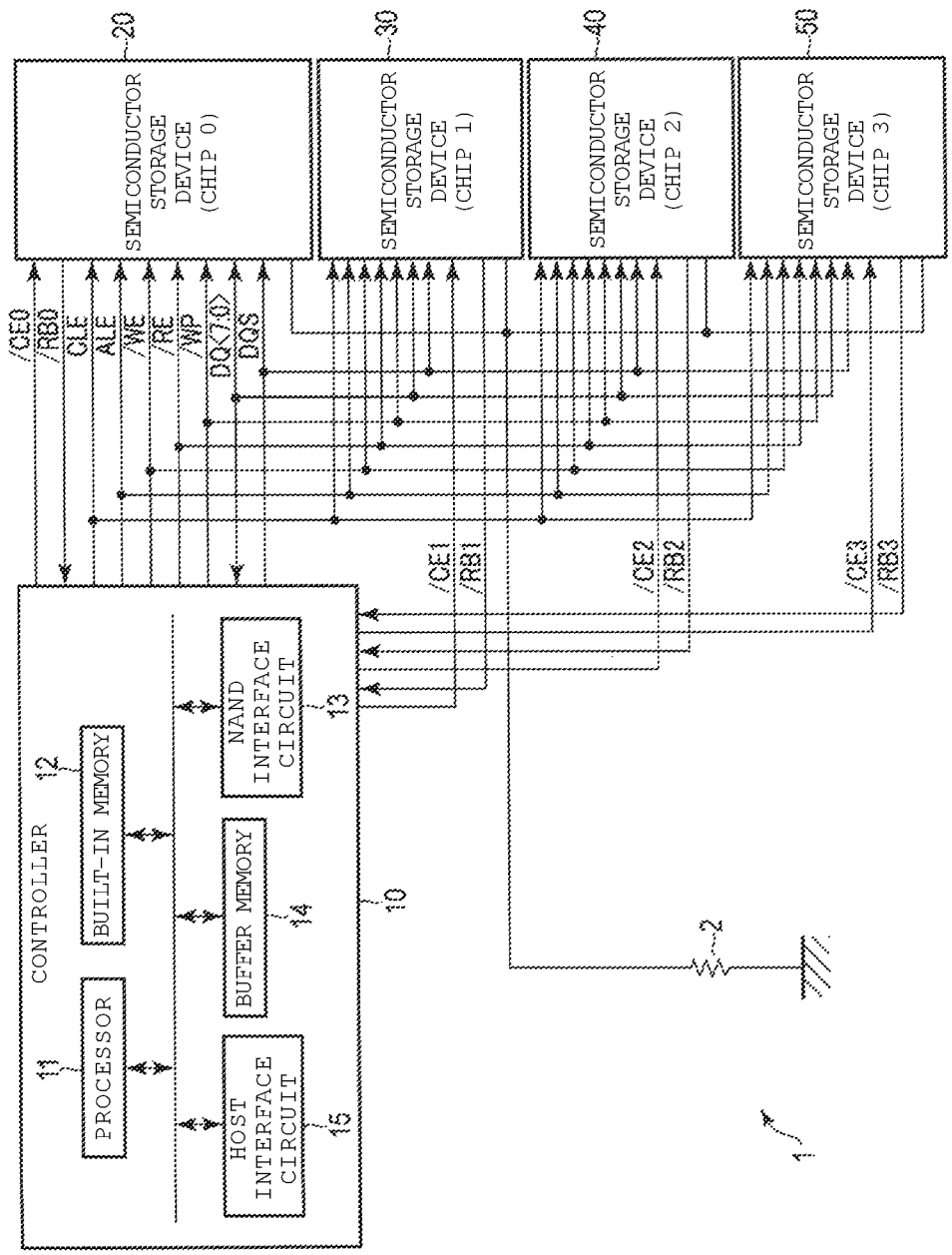
FIG. 1 is a block diagram of a memory system according to a first embodiment.

Embodiments provide a calibration operation with reduced time requirements for performing the calibration operation.

In general, according to one embodiment, a semiconductor device includes a first chip and a second chip. The first chip includes a first circuit having a first output terminal. The second chip includes a second circuit having a second output terminal, which is electrically connected to the first output terminal via a first signal line. When the first chip and the second chip receive a first command, the second circuit calibrates an output impedance at the second output terminal through a first calibration operation based on an output impedance at the first output terminal.

Hereinafter, embodiments will be described with reference to the drawings. In the following description, components having the same functions and configurations will be assigned common reference numerals.

In the following description, signals X<m:0> (m is a natural number) are (m+1)-bit signals, and mean a set of signals X<0>, X<1>, . . . , and X<m> which are respectively 1-bit signals. Components Y<m:0> mean a set of components Y<0>, Y<1>, . . . , and Y<m> which are in one-to-one correspondence with inputs or outputs of the signals X<m:0>.

1. First Embodiment

A semiconductor device according to a first embodiment will be described. The semiconductor device according to the first embodiment includes, for example, a NAND flash memory as a semiconductor storage device.

1.1 Configuration 1.1.1 Overall Configuration of Memory System

The overall configuration of a memory system according to the first embodiment will be described with reference to FIG. 1. For example, a memory system 1 communicates with an external host device (not shown). The memory system 1 stores data from the host device, or reads and returns data to the host device.

As shown in FIG. 1, the memory system 1 includes a reference resistor 2, a controller 10, and a plurality of semiconductor storage devices 20 to 50. For example, the memory system 1 is provided within one package. The controller 10 receives a command from the host device, and controls the semiconductor storage devices 20 to 50 based on the received command. Specifically, the controller 10 writes data instructed to be written from the host device in the semiconductor storage devices 20 to 50, reads data instructed by the host device to be read from the semiconductor storage devices 20 to 50, and transmits the read data to the host device. The controller 10 is connected to the semiconductor storage devices 20 to 50 through a NAND bus.

The reference resistor 2 functions as a reference resistor for calibrating output impedance of the semiconductor storage devices 20 to 50. For example, the reference resistor 2 includes one end which is grounded, and the other end which is connected to the semiconductor storage devices 20 to 50.

For example, each of the semiconductor storage devices 20 to 50 includes a plurality of memory cells, and stores data in a nonvolatile manner. The memory cell is not limited to the above-described example, and may store data in a volatile manner. For example, each of the semiconductor storage devices 20 to 50 is a semiconductor chip capable of being uniquely recognized by a chip address assigned in advance, and is able to be independently operated by an instruction of the controller 10.

In the following description, the semiconductor storage devices 20 to 50 may be respectively referred to as chips 0 to 3. Although it is described in FIG. 1 that four chips 0 to 3 are connected to the controller 10 and the reference resistor 2, the number of chips is not limited to four, and an arbitrary number of chips may be connected to the controller 10.

The same types of signals are transmitted and received through the NAND bus connected to each of the semiconductor storage devices 20 to 50. The NAND bus includes a plurality of signal lines, and transmits and receives signals /CE0 to /CE3, CLE, ALE, /WE, /RE, /WP, /RB0 to /RB3, DQ<7:0>, and DQS according to NAND interface protocol. The signals CLE, ALE, /WE, /RE, and /WP are received by the semiconductor storage devices 20 to 50, and signals /RB0 to /RB3 are received by the controller 10. The signals /CE0 to /CE3 are respectively received by the semiconductor storage devices 20 to 50.

The signals /CE0 to /CE3 are respectively signals for enabling the semiconductor storage devices 20 to 50. The signal CLE notifies the semiconductor storage devices 20 to 50 that the signals DQ<7:0> flowing in the semiconductor storage devices 20 to 50 are commands while the signal CLE is at an "H (High)" level. The signal ALE notifies the semiconductor storage devices 20 to 50 that the signals DQ<7:0> flowing in the semiconductor storage devices 20 to 50 are respectively addresses while the signal ALE is at an "H" level. The signal /WE instructs that the signals DQ<7:0> flowing in the semiconductor storage devices 20 to 50 are input to the semiconductor storage devices 20 to 50 while the signal /WE is at an "L (Low)" level. The signal /RE instructs that the signals DQ<7:0> are output from the semiconductor storage devices 20 to 50. The signal /WP instructs the semiconductor storage devices 20 to 50 to prohibit writing and erasing of data. The signals /RB0 to /RB3 indicate whether the semiconductor storage devices 20 to 50 are respectively in a ready state (state in which a command from the outside can be received) or is in a busy state (state in which a command from the outside cannot be received). For example, the signals DQ<7:0> are 8-bit signals. The signals DQ<7:0> represent a unit of data transmitted and received between the semiconductor storage devices 20 to 50 and the controller 10, and include a command, an address, or data. For example, the signal DQS is used for controlling operation timings of the semiconductor storage devices 20 to 50 which are related to the signals DQ<7:0>.

1.1.2 Configuration of Controller

Subsequently, the controller of the memory system according to the first embodiment will be described with reference to FIG. 1. The controller 10 includes a processor (central processing unit (CPU)) 11, a built-in memory (random access memory (RAM)) 12, a NAND interface circuit 13, a buffer memory 14, and a host interface circuit 15.

The processor 11 controls the entire operation of the controller 10. For example, the processor 11 responds to a write command of the data received from the host device, and issues the write command to the semiconductor storage devices 20 to 50 based on the NAND interface. This operation is true of other operations such as reading, erasing, and calibration operations.

For example, the built-in memory 12 is a semiconductor memory such as a dynamic RAM (DRAM), and is used as a work area of the processor 11. The built-in memory 12 retains firmware and various management tables for managing the semiconductor storage devices 20 to 50.

The NAND interface circuit 13 is connected to the semiconductor storage devices 20 to 50 via the above-described NAND bus, and communicates with the semiconductor storage devices 20 to 50. The NAND interface circuit 13 transmits the command, the address, and the write data to the semiconductor storage devices 20 to 50 according to the instruction of the processor 11. The NAND interface circuit 13 receives status and read data from the semiconductor storage devices 20 to 50.

The buffer memory 14 temporarily retains the data received by the controller 10 from the semiconductor storage devices 20 to 50 and the host device. For example, the buffer memory 14 may temporarily retain calibration result information acquired by performing a ZQ calibration operation or a subsequent chip calibration operation of the semiconductor storage devices 20 to 50.

The host interface circuit 15 is connected to the host device, and communicates with the host device. For example, the host interface circuit 15 respectively transfers the command and the data received from the host device to the processor 11 and the buffer memory 14.

1.1.3 Configuration of Semiconductor Device

Hereinafter, a configuration example of the semiconductor device according to the first embodiment will be described with reference to FIG. 2. In one embodiment, the semiconductor storage devices 20 to 50 have the same configuration. Thus, in the following description, the configuration of the semiconductor storage device 20 of the semiconductor storage devices 20 to 50 will be described, and the configurations of the semiconductor storage devices 30 to 50 will not be described.

Figure 2:
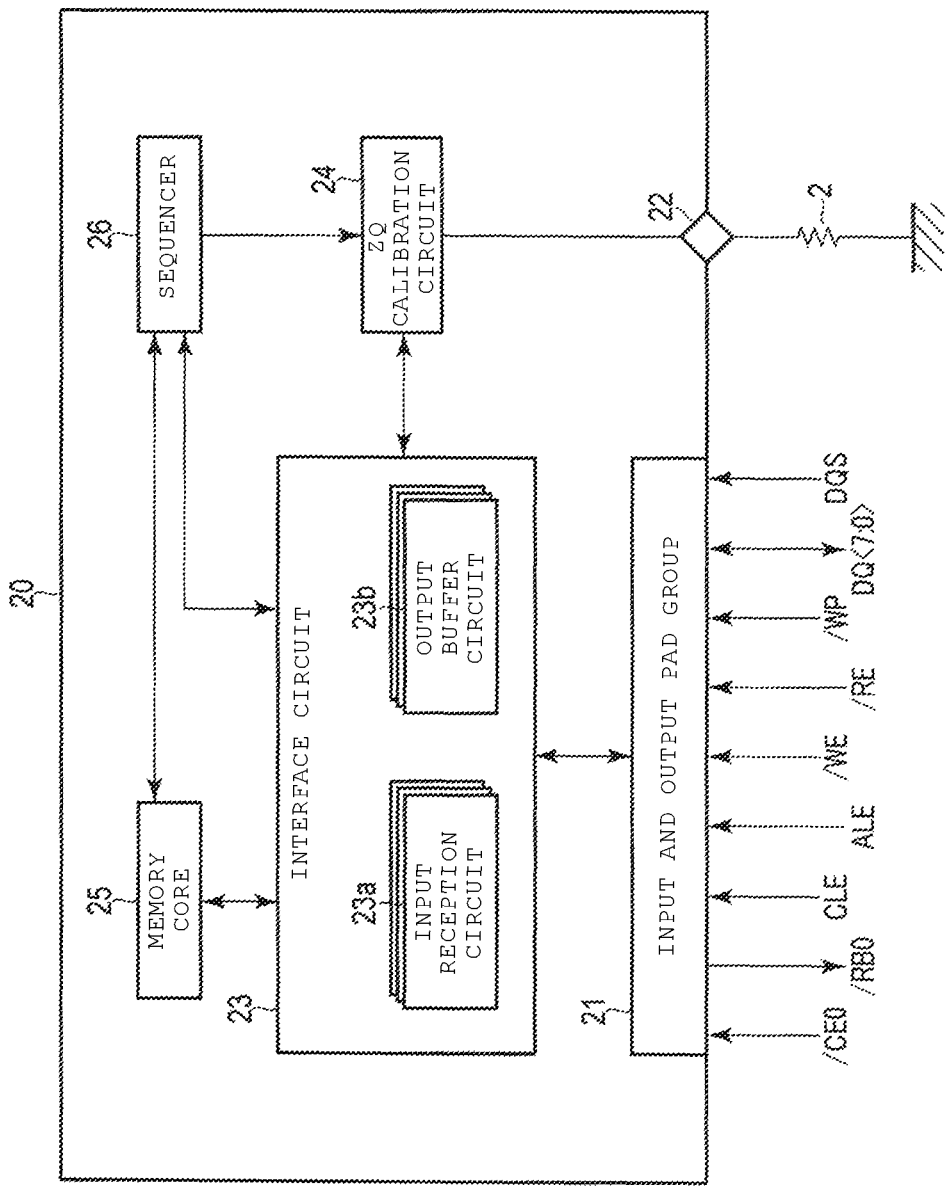
FIG. 2 is a block diagram of a semiconductor device according to the first embodiment.

As shown in FIG. 2, the semiconductor storage device 20 includes an input and output pad group 21, a ZQ pad 22, an interface circuit 23, a ZQ calibration circuit 24, a memory core 25, and a sequencer 26.

The input and output pad group 21 transfers the signals /CE0, CLE, ALE, /WE, /RE, /WP, DQ<7:0>, and DQS which are received from the controller 10, to the interface circuit 23. The input and output pad group 21 transfers the signals DQ<7:0> and /RB transmitted from the interface circuit 23, to the outside of the semiconductor storage device 20. The input and output pad group 21 includes a plurality of pads (not shown), and various signals are input and output to a certain pad via a certain signal line. One pad within the input and output pad group 21 may be recognized as one output terminal having certain output impedance from the outside of the semiconductor storage device 20.

The ZQ pad 22 includes one end which is connected to the reference resistor 2, and the other end which is connected to the ZQ calibration circuit 24. The ZQ pad 22 may be recognized as one output terminal having certain output impedance from the outside of the semiconductor storage device 20.

The interface circuit 23 transmits the commands and the addresses of the signals DQ<7:0> to the sequencer 26, and transmits and receives the data to and from the memory core 25. The interface circuit 23 includes a plurality of input reception circuits 23a and a plurality of output buffer circuits 23b. For example, the same types of signals are assigned to one output buffer circuit 23b and one input reception circuit 23a. That is, one input reception circuit 23a receives any one of the signals /CE0, CLE, ALE, /WE, /RE, /WP, and DQS from the controller 10 via one pad. One output buffer circuit 23b transfers the signal /RB0 to the controller 10 via one pad, and notifies the outside of the state of the semiconductor storage device 20. A set of one input reception circuit 23a and one output buffer circuit 23b transmits and receives the signals DQ<7:0> to and from the controller 10 via one pad. In the following description, the circuits of the plurality of input reception circuits 23a and the plurality of output buffer circuits 23b which correspond to the signal DQ<k> (k is an integer of 0≤k<8) are referred to as an input reception circuit 23a<k> and an output buffer circuit 23b<k> (not shown).

A set of the input reception circuit 23a<k> and the output buffer circuit 23b<k> has a function of performing a subsequent chip calibration operation for calibrating the output impedance of the semiconductor storage device 20 based on the output impedance of any one of other semiconductor storage devices 30 to 50 via one pad. The details of the input reception circuit 23a<k> and the output buffer circuit 23b<k> will be described below.

The ZQ calibration circuit 24 has a function of performing a ZQ calibration operation for calibrating the output impedance of the semiconductor storage device 20 using the reference resistor 2 connected via the ZQ pad 22. The details of the ZQ calibration circuit 24 will be described below.

The memory core 25 includes a memory cell array (not shown) that stores data. The memory core 25 is able to perform a reading process and a writing process of data from and in the memory cell array.

The sequencer 26 receives the command, and controls the entire semiconductor storage device 20 according to a sequence based on the received command. Specifically, for example, the sequencer 26 controls the interface circuit 23 and the ZQ calibration circuit 24 based on the command, and performs the ZQ calibration operation or the subsequent chip calibration operation.

1.1.4 Configuration of ZQ Calibration Circuit

Hereinafter, the configuration of the ZQ calibration circuit of the semiconductor device according to the first embodiment will be described.

1.1.4.1 Overall Configuration of ZQ Calibration Circuit

Figure 3:
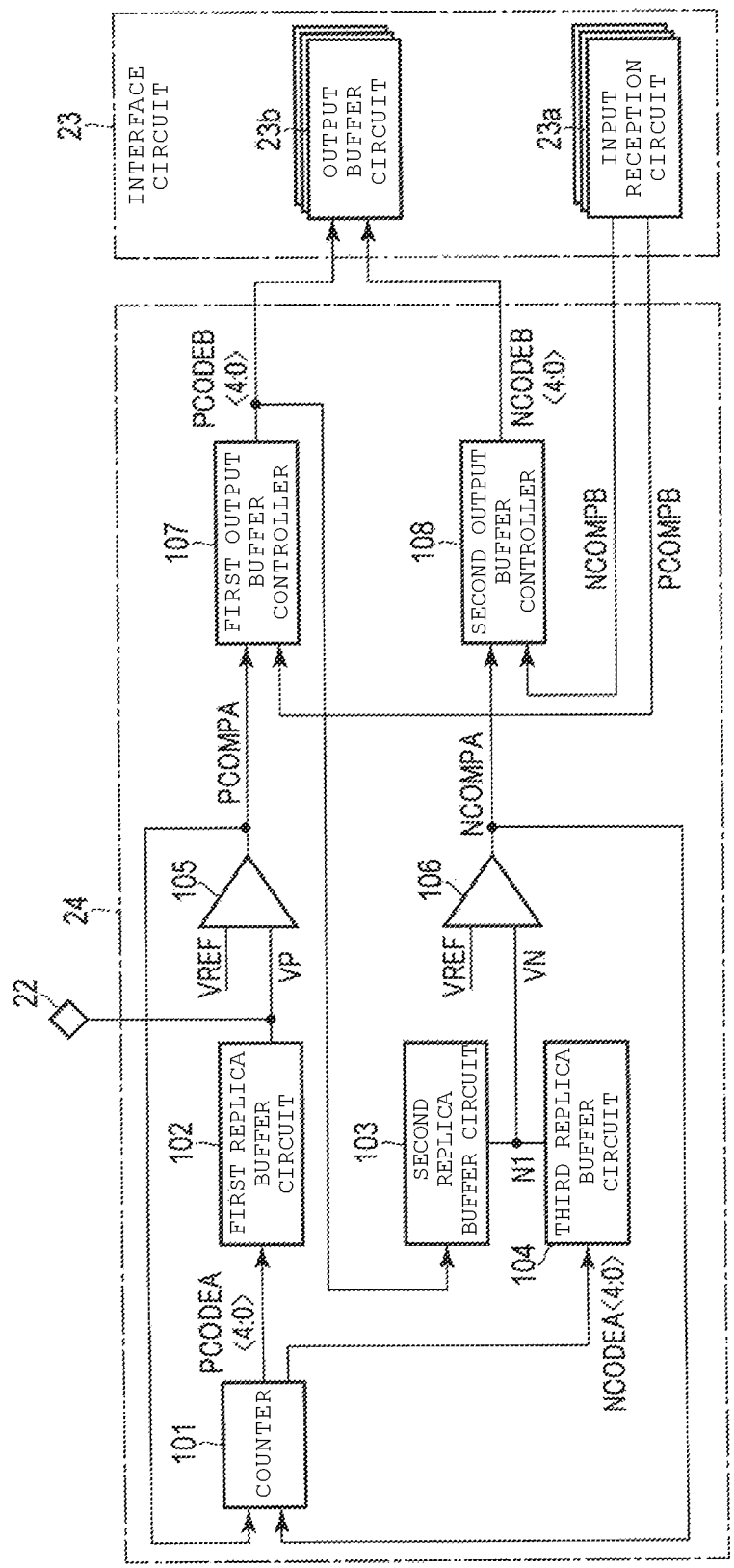
FIG. 3 is a block diagram of a ZQ calibration circuit of the semiconductor device according to the first embodiment.

The overall configuration of the ZQ calibration circuit according to the first embodiment will be described with reference to FIG. 3. As shown in FIG. 3, the ZQ calibration circuit 24 includes a counter 101, a first replica buffer circuit 102, a second replica buffer circuit 103, a third replica buffer circuit 104, a first comparator 105, a second comparator 106, a first output buffer controller 107, and a second output buffer controller 108. The ZQ calibration circuit 24 performs the ZQ calibration operation on the first replica buffer circuit 102 and the third replica buffer circuit 104.

When the ZQ calibration operation is performed on the first replica buffer circuit 102 and the third replica buffer circuit 104, the counter 101 receives an output signal PCOMPA from the first comparator 105 and an output signal NCOMPA from the second comparator 106, respectively. The counter 101 generates impedance control signals PCODEA<4:0> and NCODEA<4:0> based on count values updated depending on the output signals PCOMPA and NCOMPA. The counter 101 outputs the impedance control signals PCODEA<4:0> and NCODEA<4:0> to the first replica buffer circuit 102 and the third replica buffer circuit 104, respectively.

When the signals having the "H" level are received as the output signals PCOMPA and NCOMPA, the counter 101 updates the count values so as to increase the count values. On the other hand, when the signals having the "L" level are received as the output signals PCOMPA or NCOMPA, the counter 101 updates the count values so as to decrease the count values. When the level of the output signal PCOMPA or NCOMPA is inverted from the "H" level to the "L" level or from the "L" level to the "H" level, the counter 101 stops updating the count values.

When the impedance control signals PCODEA<4:0> are received from the counter 101, the first replica buffer circuit 102 changes impedance at an output terminal depending on the impedance control signals PCODEA<4:0>. The output terminal of the first replica buffer circuit 102 is connected to the ZQ pad 22. The first replica buffer circuit 102 transfers a voltage VP to a first input terminal of the first comparator 105 depending on the magnitude of the impedance at the output terminal. For example, the voltage VP is determined depending on a magnitude ratio between the output impedance of the first replica buffer circuit 102 and the impedance of the reference resistor 2 connected via the ZQ pad 22.

The second replica buffer circuit 103 has the substantially same configuration as that of the first replica buffer circuit 102. When the impedance control signals PCODEB<4:0> are received from the first output buffer controller 107, the second replica buffer circuit 103 changes impedance at an output terminal depending on the impedance control signals PCODEB<4:0>. The output terminal of the second replica buffer circuit 103 is connected to a node N1. The second replica buffer circuit 103 is adjusted so as to have the substantially same output impedance as that of the first replica buffer circuit 102 by the impedance control signals PCODEB<4:0>.

When the impedance control signals NCODEA<4:0> are received from the counter 101, the third replica buffer circuit 104 changes impedance at an output terminal depending on the impedance control signals NCODEA<4:0>. The output terminal of the third replica buffer circuit 104 is connected to a node N1. The third replica buffer circuit 104 transfers a voltage VN to a first input terminal of the second comparator 106 depending on the magnitude of the impedance at the output terminal. For example, the voltage VN is determined depending on a magnitude ratio between the output impedance of the third replica buffer circuit 104 and the output impedance of the second replica buffer circuit 103.

The first comparator 105 and the second comparator 106 compare the voltages at the first input terminals and the second input terminals, and send output signals corresponding to the comparison results to the counter 101 and the first output buffer controller 107, and the counter 101 and the second output buffer controller 108.

The voltage VP of the ZQ pad 22 is supplied to the first input terminal of the first comparator 105, and a voltage VREF is supplied to the second input terminal thereof. The first comparator 105 sends the output signal PCOMPA having the "H" level when the voltage VP is greater than the voltage VREF, and sends the output signal PCOMPA having the "L" level when the voltage VP is lower than the voltage VREF.

The voltage VN of the node N1 is supplied to the first input terminal of the second comparator 106, and the voltage VREF is supplied to the second input terminal thereof. The second comparator 106 sends the output signal NCOMPA having the "H" level when the voltage VN is greater than the voltage VREF, and sends the output signal NCOMPA having the "L" level when the voltage VN is lower than the voltage VREF.

The voltage VREF is set so as to be an intermediate value between a voltage VDDQ and a voltage VSS. That is, in this case, the relationship between the voltage VREF, the voltage VDDQ, and the voltage VSS satisfies "VREF=(VDDQ−VSS)/2". The voltage VDDQ is a power supply voltage supplied from the semiconductor storage device 20 in the ZQ calibration operation and the subsequent chip calibration operation, and is greater than the voltage VSS. The voltage VSS is a ground voltage, and is, for example, 0V.

The first output buffer controller 107 sets the output impedance of the first replica buffer circuit 102 acquired by the ZQ calibration operation performed on the first replica buffer circuit 102 for the plurality of output buffer circuits 23b within the interface circuit 23 and the second replica buffer circuit 103. Specifically, for example, the first output buffer controller 107 includes a counter equivalent to the counter 101, and updates the count value depending on the output signal PCOMPA from the first comparator 105 while the ZQ calibration operation is performed on the first replica buffer circuit 102. When the level of the output signal PCOMPA is inverted, the first output buffer controller 107 stops updating the count value. Here, the count value counted by first output buffer controller 107 matches the count value updated by the counter 101 while the ZQ calibration operation is performed on the first replica buffer circuit 102.

When the ZQ calibration operation is performed on the first replica buffer circuit 102, the first output buffer controller 107 sends the impedance control signals PCODEB<4:0> corresponding to the count value on which the updating is stopped to the second replica buffer circuit 103. The impedance control signals PCODEB<4:0> are also sent to the output buffer circuit 23b after the ZQ calibration operation performed on the third replica buffer circuit 104 is ended.

The first output buffer controller 107 provides feedback and sets the output impedance acquired by the subsequent-chip calibration operation performed on the interface circuit 23 for the plurality of output buffer circuits 23b of the interface circuit 23. Specifically, the first output buffer controller 107 updates the count value depending on the output signal PCOMPB from any one (for example, input reception circuit 23a<k>) of the input reception circuits 23a<7:0> while the subsequent chip calibration operation is performed on the interface circuit 23. For example, the first output buffer controller 107 updates the count value so as to increase the count value when the signal having the "H" level is received as the output signal PCOMPB, and updates the count value so as to decrease the count value when the signal having the "L" level is received. When the level of the output signal PCOMPB is inverted from the "H" level to the "L" level or from the "L" level to the "H" level, the first output buffer controller 107 stops updating the count value. The first output buffer controller 107 provides feedback on the impedance control signal PCODEB<4:0> corresponding to the updated count vale to the output buffer circuit 23b<k>. Ultimately, the first output buffer controller 107 sends the impedance control signal PCODEB<4:0> corresponding to the count value when the updating is stopped to the output buffer circuit 23b<k>. The first output buffer controller 107 sends the impedance control signal PCODEB<4:0> corresponding to the count value when the updating is stopped to another output buffer circuit 23b.

The first output buffer controller 107 generates calibration result information on a pull-up side based on the count value when the updating is stopped by the ZQ calibration operation or the subsequent chip calibration operation. The calibration result information on the pull-up side is, for example, information corresponding to a difference between the impedance control signals PCODEB<4:0> before the calibration and after the calibration, and is, for example, digital-to-analog converter (DAC) value. For example, the generated calibration result information on the pull-up side is retained in a register (not shown) within the first output buffer controller 107 so as to be applicable when various signals are subsequently output from the interface circuit 23.

The second output buffer controller 108 sets the output impedance of the third replica buffer circuit 104 acquired by the ZQ calibration operation performed on the third replica buffer circuit 104 for the plurality of output buffer circuits 23b of the interface circuit 23. Specifically, the second output buffer controller 108 includes a counter equivalent to the counter 101 therein, and updates the count value depending on the output signal NCOMPA from the second comparator 106 while the ZQ calibration operation is performed on the third replica buffer circuit 104. When the level of the output signal NCOMPA is inverted, the second output buffer controller 108 stops updating the count value. Here, the count value counted by the second output buffer controller 108 matches the count value updated depending on the counter 101 while the ZQ calibration operation is performed on the third replica buffer circuit 104. The second output buffer controller 108 sends the impedance control signal NCODEB<4:0> indicating the count value when the updating is stopped to the output buffer circuit 23b after the ZQ calibration operation performed on the third replica buffer circuit 104 is ended.

The second output buffer controller 108 provides feedback and sets the output impedance acquired by the subsequent chip calibration operation performed on the interface circuit 23 for the plurality of output buffer circuits 23b of the interface circuit 23. Specifically, the second output buffer controller 108 updates the count value depending on the output signal NCOMPB from any one (for example, input reception circuit 23a<k>) of the plurality of input reception circuits 23a<7:0> while the subsequent chip calibration operation is performed on the interface circuit 23. The second output buffer controller 108 updates the count value so as to increase the count value when the signal having the "H" level is received as the output signal NCOMPB, and updates the count value so as to decrease the count value when the signal having the "L" level is received. When the level of the output signal NCOMPB is inverted from the "H" level to the "L" level or from the "L" level to the "H" level, the second output buffer controller 108 stops updating the count value. The second output buffer controller 108 provides feedback on the impedance control signal NCODEB<4:0> corresponding to the updated count value to the output buffer circuit 23b<k>. Ultimately, the second output buffer controller 108 sends the impedance control signal NCODEB<4:0> corresponding to the count value when the updating is stopped to the output buffer circuit 23b<k>. The second output buffer controller 108 sends the impedance control signal NCODEB<4:0> corresponding to the count value when the updating is stopped to another output buffer circuit 23b.

The second output buffer controller 108 generates calibration result information on a pull-down side based on the count value when the updating is stopped by the ZQ calibration operation or the subsequent chip calibration operation. The calibration result information on the pull-down side is, for example, information corresponding to a difference between the impedance control signals NCODEB<4:0> before the calibration and after the calibration, and is, for example, a DAC value. For example, the generated calibration result information on the pull-down side is retained in a register (not shown) within the second output buffer controller 108 so as to be applicable when various signals are subsequently output from the interface circuit 23.

1.1.4.2 Configuration of Replica Buffer Circuit

Figure 4:
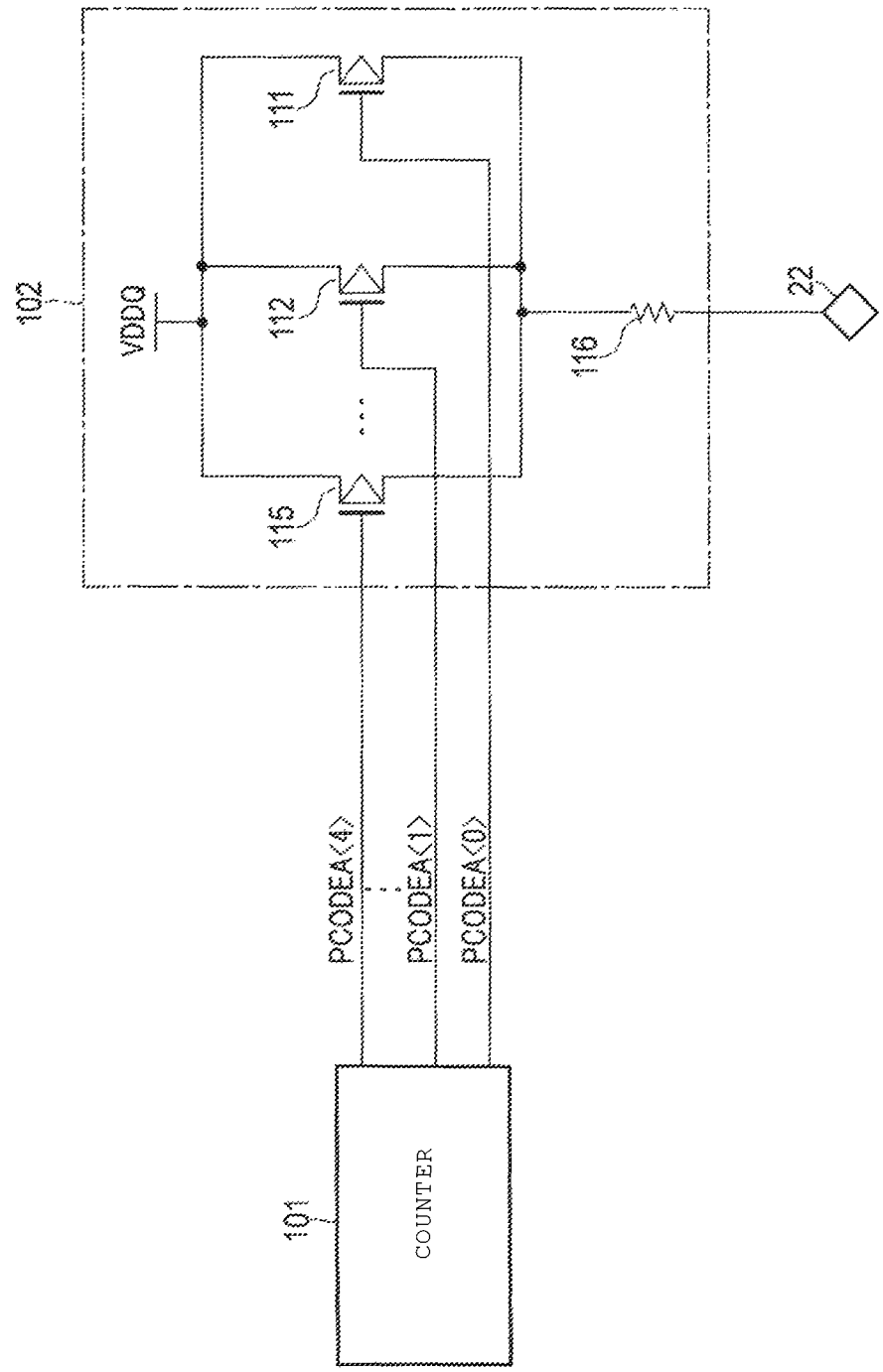
FIG. 4 is a circuit diagram of a first replica buffer circuit of the ZQ calibration circuit of the semiconductor device according to the first embodiment.
Figure 5:
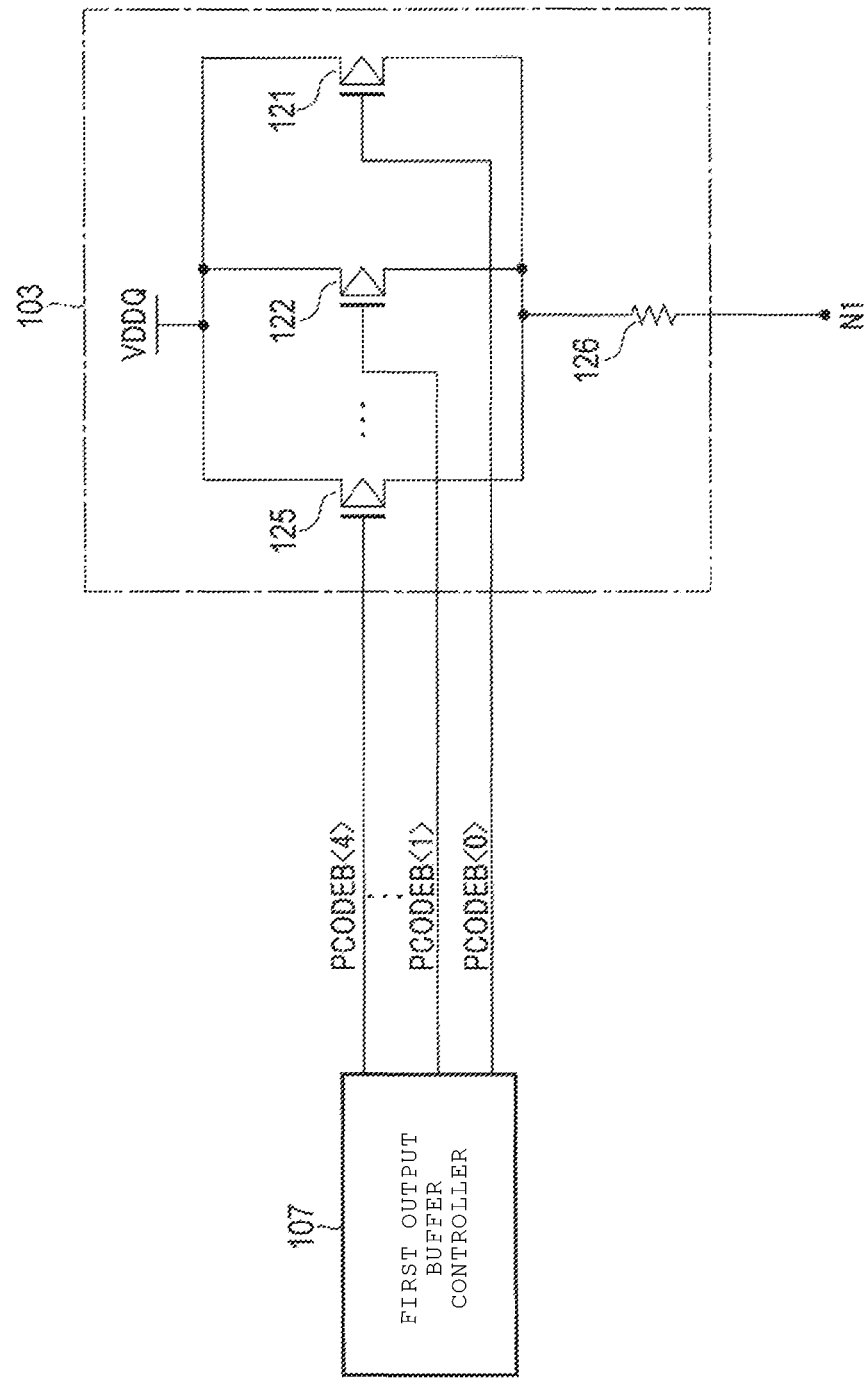
FIG. 5 is a circuit diagram of a second replica buffer circuit of the ZQ calibration circuit of the semiconductor device according to the first embodiment.
Figure 6:
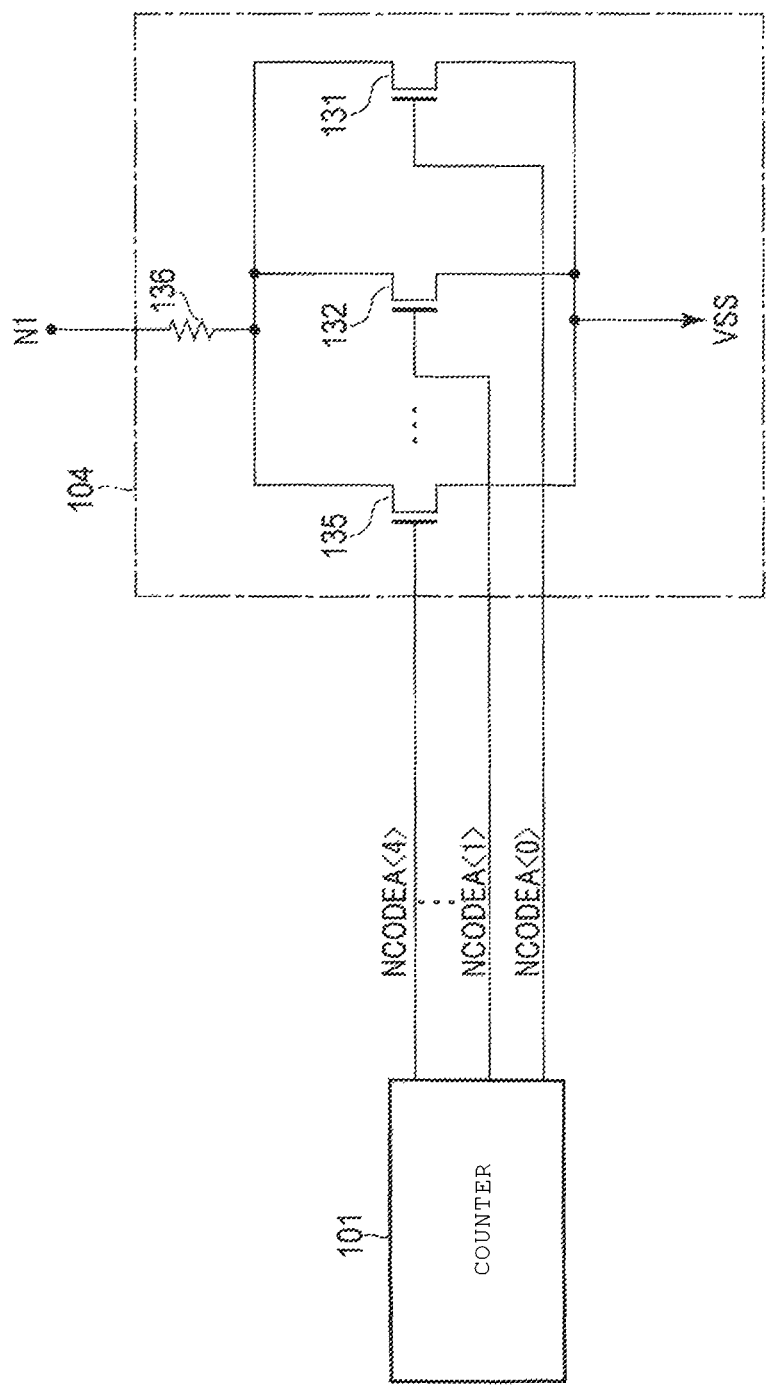
FIG. 6 is a circuit diagram of a third replica buffer circuit of the ZQ calibration circuit of the semiconductor device according to the first embodiment.

Hereinafter, the configuration of the replica buffer circuit within the ZQ calibration circuit according to the first embodiment will be described with reference to FIGS. 4 to 6.

The configuration of the first replica buffer circuit 102 will be described with reference to FIG. 4. As shown in FIG. 4, the first replica buffer circuit 102 includes, for example, five transistors 111 to 115, and a resistor 116. The number of transistors within the first replica buffer circuit 102 corresponds to the number of bits of the impedance control signal PCODEA<4:0> sent from the counter 101, and is not limited to five. An arbitrary number of transistors may be applied depending on the number of bits of the impedance control signal PCODEA<4:0>.

The transistors 111 to 115 are p-channel metal oxide semiconductor (MOS) transistors, and are connected in parallel between a power supply supplying the voltage VDDQ and one end of the resistor 116. That is, the voltage VDDQ is supplied to one end of each of the transistors 111 to 115, and the other end thereof is connected to one end of the resistor 116. The impedance control signals PCODEA<0> to PCODEA<4> are respectively input to gates of the transistors 111 to 115. The other end of the resistor 116 is connected to the ZQ pad 22.

Any one transistor of the transistors 111 to 115 is selected by the impedance control signal PCODEA<4:0> to enter an ON state. The transistors 111 to 115 enters an ON state by the "L" levels of the impedance control signals PCODEA<4:0>, and enters an OFF state by the "H" levels thereof. The transistors 111 to 115 have different sizes (on-state resistances). Thus, the transistors 111 to 115 may be selected to have any one of different on-state resistances by the impedance control signal PCODEA<4:0> changed depending on the count value of the counter 101. Specifically, for example, the transistors 111 to 115 are configured such that a combined resistance of the on-state resistances becomes smaller as the count value of the counter 101 is increased and the combined resistance of the on-state resistances becomes larger as the count value of the counter 101 is decreased.

With such a configuration, the first replica buffer circuit 102 sets a combined resistance of the resistor 116 with the transistors 111 to 115 so as to have the on-state resistance set according to the impedance control signal PCODEA<4:0>, as the output impedance for the ZQ pad 22. Accordingly, the first replica buffer circuit 102 decreases the output impedance with an increase in count value of the counter 101, and increases the output impedance with a decrease in count value thereof.

Hereinafter, the configuration of the second replica buffer circuit 103 will be described with reference to FIG. 5. As shown in FIG. 5, the second replica buffer circuit 103 includes, for example, five transistors 121 to 125, and a resistor 126.

As described above, the second replica buffer circuit 103 has the substantially same configuration as that of the first replica buffer circuit 102. That is, the transistors 121 to 125 are p-channel MOS transistors, and are connected in parallel between the power supply supplying the voltage VDDQ and one end of the resistor 126. The transistors 121 to 125 have different sizes. The other end of the resistor 126 is connected to a node N1.

The impedance control signals PCODEB<0> to PCODEB<4> are respectively input to gates of the transistors 121 to 125. The transistors 121 to 125 enters the ON state by the "L" levels of the impedance control signals PCODEB <4:0>, and enters the OFF state by the "H" levels thereof. Thus, the transistors 121 to 125 may be selected so as to have any one of different on-state resistances by the impedance control signals PCODEB<4:0> changed depending on the count value of the first output buffer controller 107. Specifically, for example, the transistors 121 to 125 are configured such that the combined resistance of the on-state resistances becomes smaller as the count value of the first output buffer controller 107 is increased and the combined resistance of the on-state resistances becomes larger as the count value of the counter 101 is decreased.

With such a configuration, the second replica buffer circuit 103 sets the combined resistance of the resistor 126 with the transistors 121 to 125 so as to have the on-state resistance set according to the impedance control signal PCODEB<4:0>, as the output impedance for the node N1. Accordingly, the second replica buffer circuit 103 decreases the output impedance with an increase in count value of the counter 101, and increases the output impedance with a decrease in count value thereof.

Hereinafter, the configuration of the third replica buffer circuit 104 will be described with reference to FIG. 6. As shown in FIG. 6, the third replica buffer circuit 104 includes, for example, five transistors 131 to 135, and a resistor 136. The number of transistors within the third replica buffer circuit 104 corresponds to the number of bits of the impedance control signal NCODEA<4:0> sent from the counter 101, and is not limited to five. An arbitrary number of transistors may be applied depending on the number of bits of the impedance control signal NCODEA<4:0>.

The transistors 131 to 135 are n-channel MOS transistors, and are connected in parallel between a ground power supply having the voltage VSS and one end of the resistor 136. That is, the voltage VSS is supplied to one end of each of the transistors 131 to 135, and the other end thereof is connected to one end of the resistor 136. The impedance control signals NCODEA<0> to NCODEA<4> are respectively input to gates of the transistors 131 to 135. The other end of the resistor 136 is connected to a node N1.

Any one transistor of the transistors 131 to 135 is selected by the impedance control signals NCODEA<4:0> to enter the ON state. The transistors 131 to 135 enters the ON state by the "H" levels of the impedance control signals NCODEA<4:0>, and enters the OFF state by the "L" level thereof. The transistors 131 to 135 have different sizes. Thus, the transistors 131 to 135 may be selected so as to have any one of different on-state resistances by the impedance control signal NCODEA<4:0> changed depending on the count value of the counter 101. Specifically, for example, the transistors 131 to 135 are configured such that the combined resistance of the on-state resistances becomes larger as the count value of the counter 101 is increased and the combined resistance of the on-state resistances becomes smaller as the count value of the counter 101 is decreased.

With such a configuration, the third replica buffer circuit 104 sets the combined resistance of the resistor 136 with the transistors 131 to 135 so as to have the on-state resistance set according to the impedance control signal NCODEA<4:0>, as the output impedance for the node N1. Accordingly, the third replica buffer circuit 104 increases the output impedance with an increase in count value of the counter 101, and decreases the output impedance with a decrease in count value thereof.

1.1.5 Configuration of Interface Circuit

Hereinafter, the configuration of the interface circuit of the semiconductor device according to the first embodiment will be described.

1.1.5.1 Connection with Input and Output Pad

Figure 7:
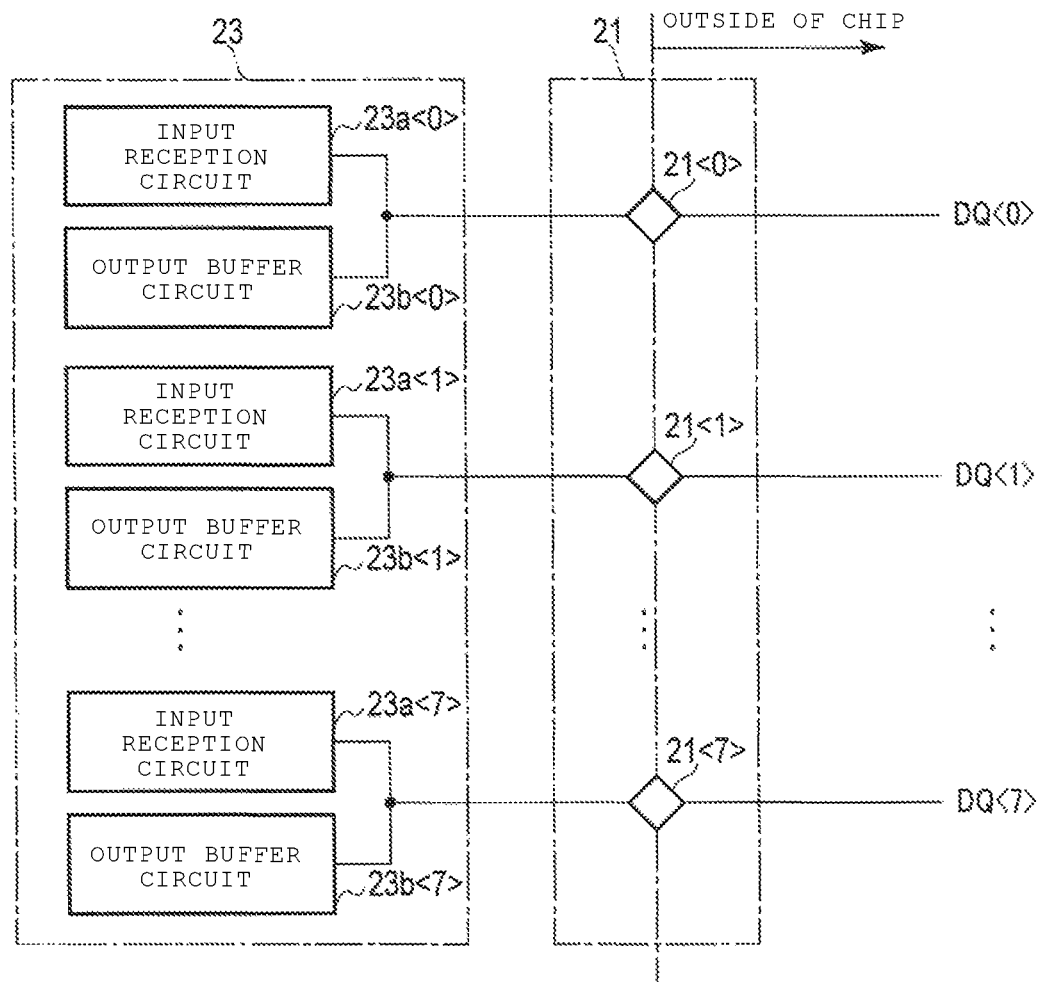
FIG. 7 is a block diagram depicting connections between an interface circuit and an input and output pad of the semiconductor device according to the first embodiment.

The connection of the interface circuit according to the first embodiment with the input and output pad will be described with reference to FIG. 7. As shown in FIG. 7, the input and output pad group 21 includes a plurality of pads 21<7:0> that respectively transmits a plurality of signals DQ<7:0>. FIG. 7 illustrates an example in which the plurality of pads 21<7:0> which transmits the signals DQ<7:0>, is connected with the interface circuit 23 within the input and output pad group 21.

As stated above, the interface circuit 23 includes input reception circuits 23a<7:0> and output buffer circuits 23b<7:0>. For example, a set of one input reception circuit 23a<k> and one output buffer circuit 23b<k> is connected to one pad 21<k>.

The set of the input reception circuit 23a<k> and the output buffer circuit 23b<k> connected to the pads 21<7:0> has the substantially same configuration. Thus, in the following description, the configuration of one set of input reception circuit 23a<k> and output buffer circuit 23b<k> connected to a certain pad 21<k> will be described as an example.

1.1.5.2 Configuration of Output Buffer Circuit

Figure 8:
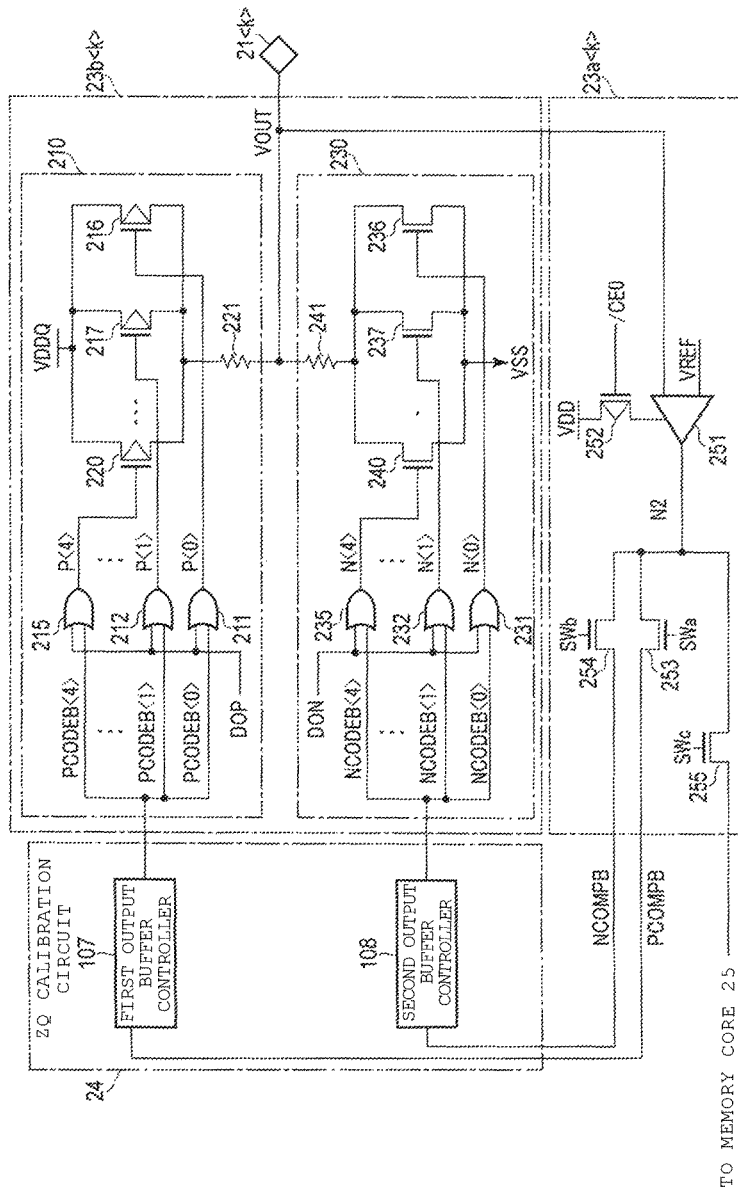
FIG. 8 is a circuit diagram of the interface circuit of the semiconductor device according to the first embodiment.

The configuration of the output buffer circuit of the interface circuit according to the first embodiment will be described with reference to FIG. 8. As shown in FIG. 8, the output buffer circuit 23b<k> includes a pull-up circuit 210 and a pull-down circuit 230.

The pull-up circuit 210 includes five OR circuits 211 to 215, five transistors 216 to 220, and a resistor 221.

The impedance control signals PCODEB<0> to PCODEB<4> are respectively input to first input terminals of the OR circuits 211 to 215. A pull-up signal DOP is input to second input terminals of the OR circuits 211 to 215. The OR circuits 211 to 215 output results of logical OR operation on the impedance control signals PCODEB<0> to PCODEB<4> and the pull-up signal DOP, as operation signals P<0> to P<4>. The output operation signals P<0> to P<4> are respectively input to gates of the transistors 216 to 220.

The transistors 216 to 220 are p-channel MOS transistors, and are connected in parallel between the power supply supplying the voltage VDDQ and the resistor 221. Specifically, the voltage VDDQ is supplied to one end of each of the transistors 216 to 220, and the other end thereof is connected to one end of the resistor 221. The other end of the resistor 221 is connected to a pad 21<k>.

The transistors 216 to 220 have sizes greater than those of the transistors 111 to 115. Thus, the pull-up circuit 210 has driving capability higher than that of the first replica buffer circuit 102. That is, the pull-up circuit 210 changes a voltage VOUT at a higher rate than the first replica buffer circuit 102 changes the voltage VP.

With such a configuration, the pull-up circuit 210 sets the combined resistance of the resistor 221 with the transistors 216 to 220 so as to have the on-state resistance set by the impedance control signal PCODEB<4:0>, as the output impedance. Accordingly, the pull-up circuit 210 decreases the output impedance with an increase in count value of the first output buffer controller 107, and increases the output impedance with a decrease in count value thereof.

The pull-down circuit 230 includes five AND circuits 231 to 235, five transistors 236 to 240, and a resistor 241.

The impedance control signals NCODEB<0> to NCODEB<4> sent from the second output buffer controller 108 are respectively input to first input terminals of the AND circuits 231 to 235. A pull-down signal DON is input to second input terminals of the AND circuits 231 to 235. The AND circuits 231 to 235 output results of logical AND operation on the impedance control signals NCODEB<0> to NCODEB<4> and the pull-down signal DON, as operations signals N<0> to N<4>. The output operation signals N<0> to N<4> are input to gates of the transistors 236 to 240.

The transistors 236 to 240 are n-channel MOS transistors, and are connected in parallel between the ground having the voltage VSS and the resistor 241. Specifically, the voltage VSS is supplied to one end of each of the transistors 236 to 240, and the other end thereof is connected to one end of the resistor 241. The other end of the resistor 241 is connected to the pad 21<k>.

The transistors 236 to 240 have sizes greater than those of the transistors 131 to 135. Thus, the pull-down circuit 230 has driving capability higher than that of the third replica buffer circuit 104. That is, the pull-down circuit 230 changes the voltage VOUT at a higher rate than the third replica buffer circuit 104 changes the voltage VN.

With such a configuration, the pull-down circuit 230 sets the combined resistance of the resistor 241 with the transistors 236 to 240 so as to have the on-state resistance set by the impedance control signal NCODEB<4:0>, as the output impedance. Accordingly, the pull-down circuit 230 increases the output impedance with an increase in count value of the second output buffer controller 108, and decreases the output impedance with a decrease in count value thereof.

In one embodiment, the pull-up signal DOP and the pull-down signal DON are pulse signals, and levels of the pulse signals are controlled depending on a level of data signal output from the pad 21<k>. Specifically, for example, when a data signal having an "H" level is output from the pad 21<k>, both the pull-up signal DOP and the pull-down signal DON are controlled to have an "L" level by the interface circuit 23. When a data signal having an "L" level is output from the pad 21<k>, both the pull-up signal DOP and the pull-down signal DON are controlled to have an "H" level by the interface circuit 23. When the inside and the outside of the pad 21<k> are electrically disconnected, the pull-up signal DOP is controlled to have the "H" level, and the pull-down signal DON is controlled to have the "L" level.

1.1.5.3 Configuration of Input Reception Circuit

Hereinafter, the configuration of the input reception circuit of the interface circuit according to the first embodiment will be described by referring to FIG. 8 again.

The input reception circuit 23a<k> has a function of determining the level of the data signal input from the pad 21<k> and transmitting the determination result to the memory core 25 or the ZQ calibration circuit 24. For example, the input reception circuit 23a<k> includes a third comparator 251 and transistors 252 to 255.

The third comparator 251 is a comparator which is operated by receiving the voltage VDD from the power supply, and includes a power input terminal connected to one end of the transistor 252. The voltage VOUT of the pad 21<k> is supplied to a first input terminal of the third comparator 251, and the voltage VREF is supplied to a second input terminal thereof. The third comparator 251 compares the voltages of the first input terminal and the second input terminal, and sends an output signal corresponding to the comparison result to a node N2. For example, the third comparator 251 sends an output signal having an "H" level when the voltage VOUT of the pad 21<k> is greater than the voltage VREF, and sends an output signal having an "L" level when the voltage VOUT is less than the voltage VREF.

The transistor 252 is a p-channel MOS transistor. The signal /CE0 is input to a gate of the transistor 252, one end of this transistor is connected to the power input terminal of the third comparator 251, and the voltage VDD is supplied to the other end thereof. That is, the transistor 252 enters an OFF state when the signal /CE0 has the "H" level, and enters an ON state when this signal has the "L" level.

The transistors 253 to 255 are n-channel MOS transistors. Signals SWa, SWb, and SWc are input to gates of the transistors 253 to 255, one ends of these transistors are connected to the node N2, and the other ends thereof are connected to the first output buffer controller 107, the second output buffer controller 108, and the memory core 25, respectively.

That is, the transistor 253 enters an ON state when the signal SWa has the "H" level, and transfers the output signal PCOMPB output from the third comparator 251 to the first output buffer controller 107. The transistor 253 enters an OFF state when the signal SWa has the "L" level, and disconnects the third comparator 251 from the first output buffer controller 107.

The transistor 254 enters an ON state when the signal SWb has the "H" level, and transfers the output signal NCOMPB output from the third comparator 251 to the second output buffer controller 108. The transistor 254 enters an OFF state when the signal SWb has the "L" level, and disconnects the third comparator 251 from the second output buffer controller 108.

The transistor 255 enters an ON state when the signal SWc has the "H" level, and transfers the signal output from the third comparator 251 to the memory core 25. The transistor 255 enters an OFF state when the signal SWc has the "L" level, and disconnects the third comparator 251 from the memory core 25.

1.2 Operation

Hereinafter, the operation of the semiconductor device according to the first embodiment will be described.

1.2.1 Outline of Calibration Operation

Figure 9:
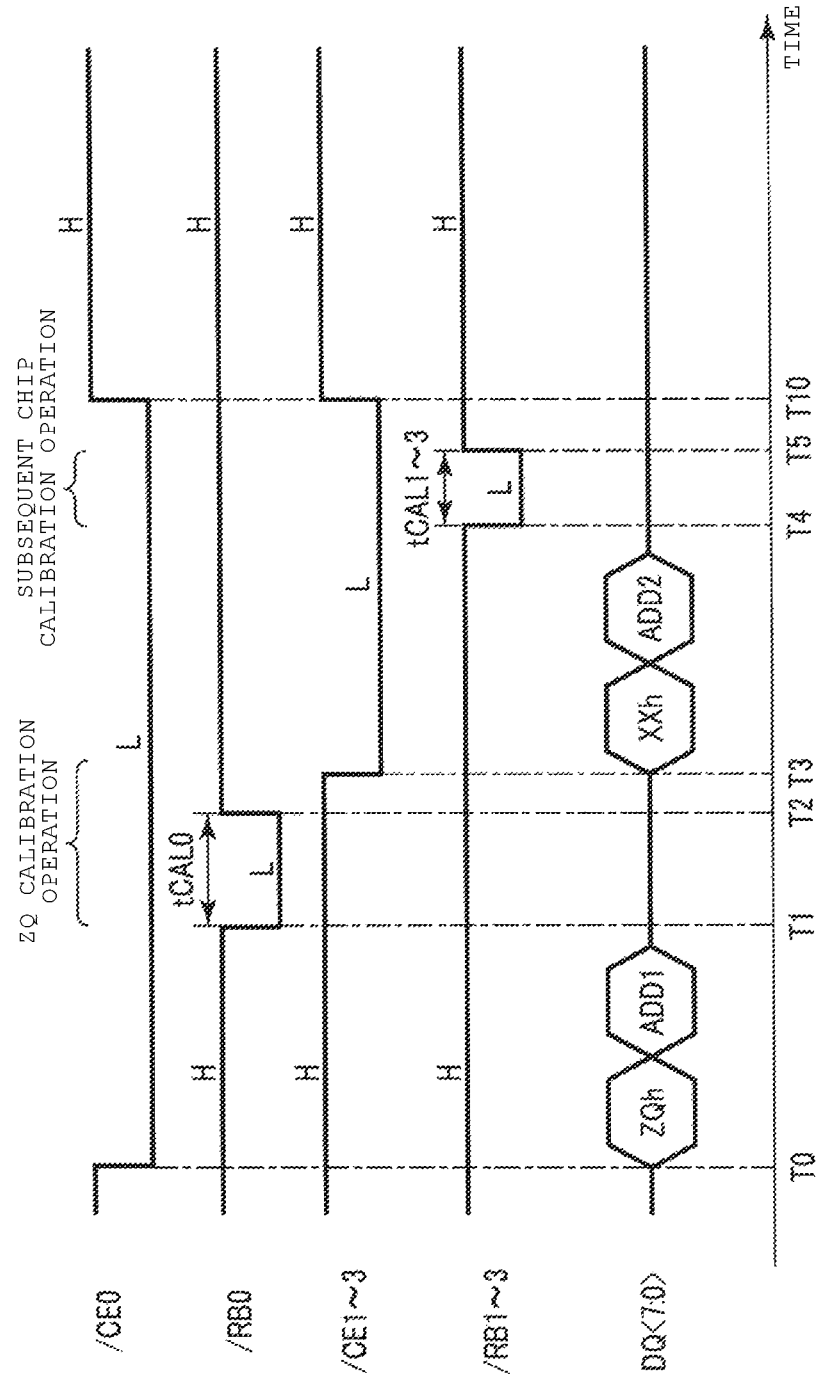
FIG. 9 is a timing chart for describing a ZQ calibration operation and a subsequent chip calibration operation of the semiconductor device, according to the first embodiment.

The outline of the calibration operation according to the first embodiment will be described using a timing chart shown in FIG. 9. As shown in FIG. 9, the calibration operation according to the first embodiment includes the ZQ calibration operation and the subsequent chip calibration operation. In FIG. 9, an example of an operation when the semiconductor storage device 20 performs the ZQ calibration operation and the semiconductor storage devices 30 to 50 perform the subsequent chip calibration operation with the semiconductor storage device 20 is illustrated.

Initially, the controller 10 causes the semiconductor storage device 20 to perform the ZQ calibration operation. Specifically, at a time T0, the controller 10 sets the signal /CE0 to be at the "L" level and enables the semiconductor storage device 20. The signals /CE1 to /CE3 are maintained at the "H" level. Subsequently, the controller 10 issues a command "ZQh", and transmits the issued command to the semiconductor storage device 20. The command "ZQh" is a command to perform the ZQ calibration operation.

After issuing the command "ZQh", the controller 10 issues an address ADD1 over one cycle, and transmits the issued address to the semiconductor storage devices 20 to 50. For example, the address ADD1 designates a chip address of the semiconductor storage device 20 to be subject to the ZQ calibration operation.

When a "ZQ calibration command" including the command "ZQh" and the address ADD1, is stored in the register within the semiconductor storage device 20, the sequencer 26 controls the interface circuit 23 and the ZQ calibration circuit 24, and starts the ZQ calibration operation.

At a time T1, the semiconductor storage device 20 sets the signal /RB0 to be at the "L" level, and notifies the controller 10 that semiconductor storage device 20 is in a busy state. A period tCAL0 indicates a period during which the ZQ calibration operation is performed by the semiconductor storage device 20. After the ZQ calibration operation is ended, the semiconductor storage device 20 sets the signal /RB0 to be at the "H" level and notifies the controller 10 that the semiconductor storage device 20 is in a ready state at a time T2.

Subsequently, the controller 10 causes the semiconductor storage devices 30 to 50 to perform the subsequent chip calibration operation. Specifically, at a time T3, the controller 10 sets the signals /CE1 to /CE3 to be at the "L" level, and enables the semiconductor storage devices 30 to 50. The signal /CE0 is continuously maintained at the "L" level from time T0. Subsequently, the controller 10 issues a command "XXh", and transmits the issued command to the semiconductor storage devices 20 to 50. The command "XXh" is a command to a semiconductor storage device to perform the subsequent chip calibration operation for calibrating the output impedance thereof using the output impedance of another one of the semiconductor storage devices as a reference.

In the following description, the semiconductor storage device serving as the reference in the subsequent chip calibration operation is referred to as a "reference chip", and the semiconductor storage device of which the output impedance is calibrated is referred to as a "calibration chip". That is, in FIG. 9, the semiconductor storage device 20 is the reference chip, and the semiconductor storage devices 30 to 50 are the calibration chips. The same is true in the following description unless the context clearly indicates otherwise.

For example, the controller 10 issues an address ADD2 over one cycle, and transmits the issued address to the semiconductor storage devices 20 to 50. For example, the address ADD2 designates a chip address of the reference chip in the subsequent chip calibration operation. For example, each of the semiconductor storage devices 20 to 50 recognizes itself as the calibration chip when its chip address is not designated by the address ADD2.

When a "subsequent chip calibration command" including the command "XXh" and the address ADD2, is stored in the registers of the semiconductor storage devices 30 to 50, each of the semiconductor storage devices 30 to 50 controls the interface circuit 23 and the ZQ calibration circuit 24, and starts the subsequent chip calibration operation. At a time T4, the semiconductor storage devices 30 to 50 set the signals /RB1 to /RB3 to be at the "L" level, and notify the controller 10 that the semiconductor storage devices 30 to 50 are in the busy state. Periods tCAL1-3 respectively indicate periods during which the subsequent chip calibration operation is performed for the semiconductor storage devices 30 to 50 using the semiconductor storage device 20 as the reference chip. In the example of FIG. 9, all the periods tCAL1 to 3 are included in a period from the time T4 to a time T5. After the subsequent chip calibration operation is ended, the semiconductor storage devices 30 to 50 set the signals /RB1 to /RB3 to be at the "H" level and notify the controller 10 that the semiconductor storage devices 30 to 50 are in the ready state at the time T5.

At a time T10, the controller 10 sets the signals /CE0 to /CE3 to be at the "H" level, and disables all the semiconductor storage devices 20 to 50.

With this, the ZQ calibration operation and the subsequent chip calibration operation are ended.

1.2.2 Details of Calibration Operation

Figure 10:
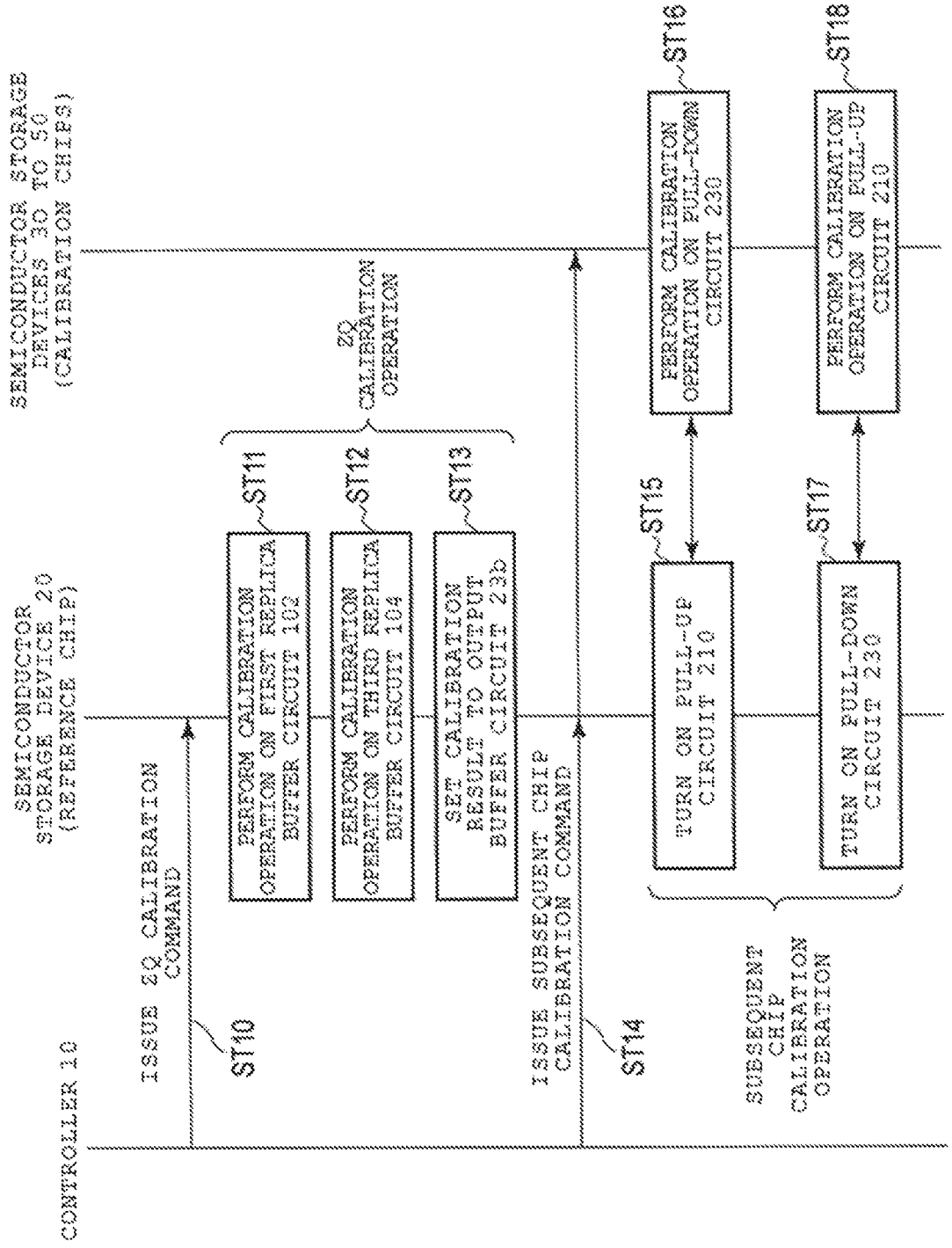
FIG. 10 is a flowchart for describing the ZQ calibration operation and the subsequent chip calibration operation of the semiconductor device, according to the first embodiment.

Hereinafter, the details of the calibration operation of the semiconductor device according to the first embodiment will be described using a flowchart shown in FIG. 10. FIG. 10 illustrates the ZQ calibration operation performed by the semiconductor storage device 20 (which is the reference chip) and the subsequent chip calibration operation performed by the semiconductor storage devices 30 to 50 (each of which is a calibration chip) using the reference chip.

As shown in FIG. 10, in step ST10, the controller 10 issues the command "ZQh" as the ZQ calibration command and the address ADD1.

In steps ST11 to ST13, the reference chip performs the ZQ calibration operation.

Specifically, in step ST11, the ZQ calibration circuit 24 of the reference chip performs the ZQ calibration operation on the first replica buffer circuit 102. That is, the first comparator 105 outputs the output signals PCOMPA having the same level to the counter 101 until the voltage VP of the ZQ pad 22 is approximately the same as the voltage VREF. The counter 101 increases or decreases the count value until the levels of the output signals PCOMPA are inverted, and outputs the impedance control signal PCODEA<4:0> corresponding to the count value. The first replica buffer circuit 102 sets the transistor of the transistors 111 to 115 selected by the impedance control signal PCODEA<4:0>, to be in the ON state. Accordingly, the voltage VP is adjusted until the voltage VP is approximately the same as the voltage VREF. After the voltage VP is approximately the same as the voltage VREF, the first output buffer controller 107 generates the impedance control signal PCODEB<4:0> as the result of the ZQ calibration operation on the pull-up side. The first output buffer controller 107 sets the impedance control signal PCODEB<4:0> for the second replica buffer circuit 103. The second replica buffer circuit 103 sets the transistor of the transistors 121 to 125 selected by the impedance control signal PCODEB<4:0>, to be in the ON state.

In step ST12, the ZQ calibration circuit 24 of the reference chip performs the ZQ calibration operation on the third replica buffer circuit 104. That is, the second comparator 106 outputs the output signals NCOMPA having the same level to the counter 101 until the voltage VN of the node N1 is approximately the same as the voltage VREF. The counter 101 increases or decreases the count value until the levels of the output signals NCOMPA are inverted, and sends the impedance control signal NCODEA<4:0> corresponding to the count value. The third replica buffer circuit 104 sets the transistor of the transistors 131 to 135 selected by the impedance control signal NCODEA<4:0>, to be in the ON state. Accordingly, the voltage VN is adjusted until the voltage VN is approximately the same as the voltage VREF. After the voltage VN is approximately the same as the voltage VREF, the second output buffer controller 108 generates the impedance control signal NCODEB<4:0> as the result of the ZQ calibration operation on the pull-down side.

In step ST13, the first output buffer controller 107 and the second output buffer controller 108 of the reference chip respectively output the impedance control signals PCODEB<4:0> and NCODEB<4:0> to the output buffer circuit 23b. The output impedances of the output buffer circuit 23b on the pull-up circuit 210 and the pull-down circuit 230 are set based on the impedance control signals PCODEB<4:0> and NCODEB<4:0>.

Through the above-described operation, the output impedance of the reference chip is calibrated.

Subsequently, in step ST14, the controller 10 issues the command "XXh" as the subsequent chip calibration command and the address ADD2.

In steps ST15 to ST18, each calibration chip performs the subsequent chip calibration operation with the reference chip. Specifically, each calibration chip performs the subsequent chip calibration operation with the reference chip on the pull-down circuit 230 in steps ST15 and ST16, and performs the subsequent chip calibration operation on the pull-up circuit 210 with respect to the reference chip insteps ST17 and ST18. In steps ST15 to ST18, the calibration chips are electrically connected to the reference chip via different signal lines connected to the pad 21<k>. In the following description related to steps ST15 to ST18, only a portion electrically connected between one certain calibration chip and the reference chip will be described.

In step ST15, the pull-up circuit 210 within the reference chip enters the ON state, and the pull-down circuit 230 enters the OFF state. Meanwhile, in step ST16, the pull-up circuit 210 within each calibration chip enters the OFF state, and the pull-down circuit 230 enters the ON state. Also, the transistor 254 within each calibration chip enters the ON state, and the transistors 253 and 255 enter the OFF state.

Within each calibration chip, the third comparator 251 outputs the output signal NCOMPB via the transistor 254 until the voltage VOUT is approximately the same as the voltage VREF. The second output buffer controller 108 increases or decreases the count value until the level of the output signal NCOMPB is inverted, and outputs the impedance control signal NCODEB<4:0> corresponding to the count value. The pull-down circuit 230 sets the transistor of the transistors 236 to 240 which is selected by the impedance control signal NCODEB<4:0> to be in the ON state. Accordingly, the voltage VOUT is adjusted until the voltage VOUT is approximately the same as the voltage VREF. After the voltage VOUT is approximately the same as the voltage VREF, the second output buffer controller 108 generates the impedance control signal NCODEB<4:0> as the result of the subsequent chip calibration operation on the pull-down circuit 230.

Through the above-described operation, the output impedance of the pull-down circuit 230 of each calibration chip is calibrated.

Subsequently, in steps ST17 and ST18, each calibration chip performs the subsequent chip calibration operation on the pull-up circuit 210 with respect to the reference chip.

In step ST17, the pull-up circuit 210 within the reference chip enters the OFF state, and the pull-down circuit 230 enters the ON state. Meanwhile, in step ST18, the pull-up circuit 210 within each calibration chip enters the ON state, and the pull-down circuit 230 enters the OFF state. Also, the transistor 253 within each calibration chip enters the ON state, and the transistors 254 and 255 enter the OFF state.

Within each calibration chip, the third comparator 251 outputs the output signal PCOMPB via the transistor 253 until the voltage VOUT is approximately the same as the voltage VREF. The first output buffer controller 107 increases or decreases the count value until the level of the output signal PCOMPB is inverted, and outputs the impedance control signal PCODEB<4:0> corresponding to the count value. The pull-up circuit 210 sets the transistor of the transistors 216 to 220 which is selected by the impedance control signal PCODEB<4:0> to be in the On state. Accordingly, the voltage VOUT is adjusted until the voltage VOUT is approximately the same as the voltage VREF. After the voltage VOUT is approximately the same as the voltage VREF, the first output buffer controller 107 generates the impedance control signal PCODEB<4:0> as the result of the subsequent chip calibration operation on the pull-up circuit 210.

Through the above-described operation, the output impedance of the pull-up circuit 210 of each calibration chip is calibrated. An example in which the subsequent chip calibration operation on the pull-down circuit 230 is performed before the subsequent chip calibration operation on the pull-up circuit 210 is described in the example of FIG. 10. However, embodiments of the present disclosure are not limited thereto. For example, the steps ST15 and ST16 shown in FIG. 10 may be performed after steps ST17 and ST18.

In the subsequent chip calibration operation, the signal line that electrically connects the reference chip and the calibration chip may be determined in advance for each chip. In FIG. 11, an example of the signal line assigned to each chip provided within the memory system 1 when the subsequent chip calibration operation is performed will be described.

As shown in FIG. 11, when the semiconductor storage device 20 is the calibration chip in the subsequent chip calibration operation, the semiconductor storage device 20 is electrically connected to the reference chip by using the signal line through which the signal line DQ<0> is communicated. In this case, the chips of the semiconductor storage devices 30 to 50 except for the reference chip are electrically disconnected from the signal line through which the signal DQ<0> is communicated.

Similarly, when the semiconductor storage devices 30 to 50 are the calibration chips in the subsequent chip calibration operation, the semiconductor storage devices 30 to 50 are electrically connected to the reference chip by using the signal lines through which the signals DQ<1> to DQ<3> are communicated. When the semiconductor storage device 30 is the calibration chip, the chips of the semiconductor storage devices 20, 40, and 50 except for the reference chip are electrically disconnected from the signal line through which the signal DQ<1> is communicated. When the semiconductor storage device 40 is the calibration chip, the chips of the semiconductor storage devices 20, 30, and 50 except for the reference chip are electrically disconnected from the signal line through which the signal DQ<2> is communicated. When the semiconductor storage device 50 is the calibration chip, the chips of the semiconductor storage devices 20 to 40 except for the reference chip are electrically disconnected from the signal line through which the signal DQ<3> is communicated.

In the example of FIG. 11, the signal lines through which the signals DQ<4> to DQ<7> are communicated are not used when the subsequent chip calibration operation is performed. However, the present invention is not limited to the example of FIG. 11. The signal line may be assigned to each calibration chip, an arbitrary signal line combination of the signal lines through which the signals DQ<7:0> are communicated may be used in the subsequent chip calibration operation.

Figure 12:
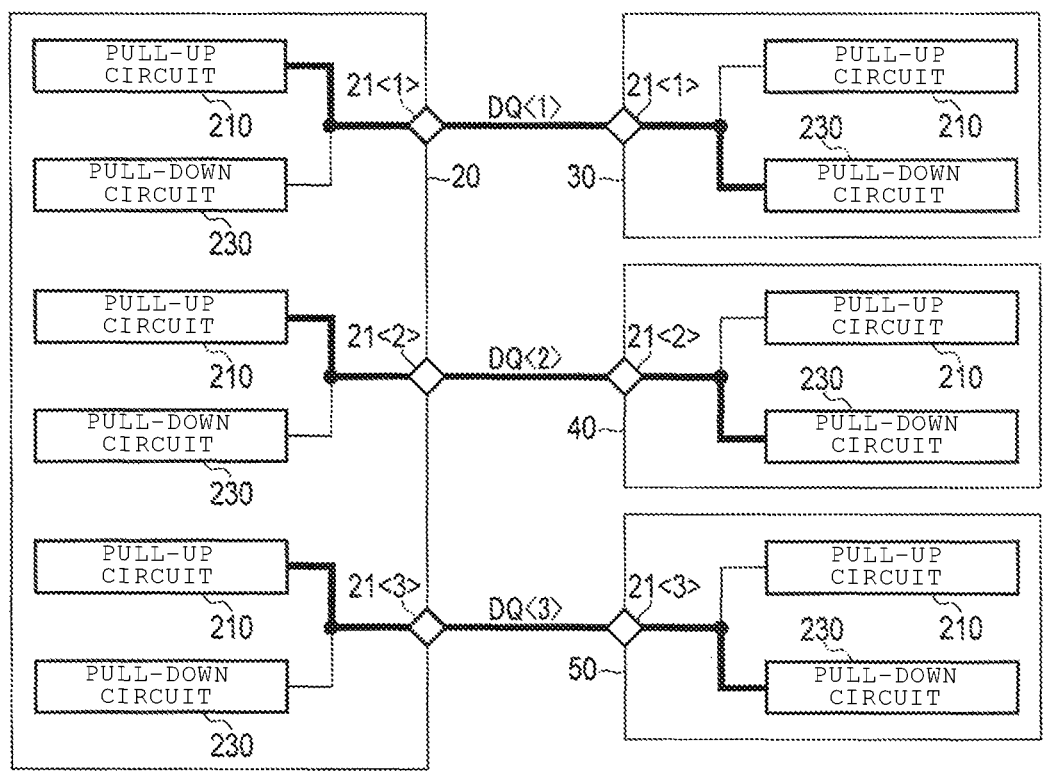
FIG. 12 is a schematic diagram that illustrates the subsequent chip calibration operation on a pull-up side of the semiconductor device, according to the first embodiment.

When the setting example of FIG. 11 is applied, the semiconductor storage devices 20 to 50 have the connection relationship shown in FIG. 12 when steps ST15 and ST16 of FIG. 10 are performed.

That is, as shown in FIG. 12, in step ST15, in the semiconductor storage device 20 which is the reference chip, three pull-up circuits 210 which are respectively connected to the pads 21<1> to 21<3> enter the ON state, and three pull-down circuits 230 enter the OFF state.

In step ST16, in the semiconductor storage devices 30 to 50 which are the calibration chips, the pull-up circuits 210 connected to the pads 21<1> to 21<3> enter the OFF state, and the pull-down circuits 230 enter the ON state.

Figure 13:
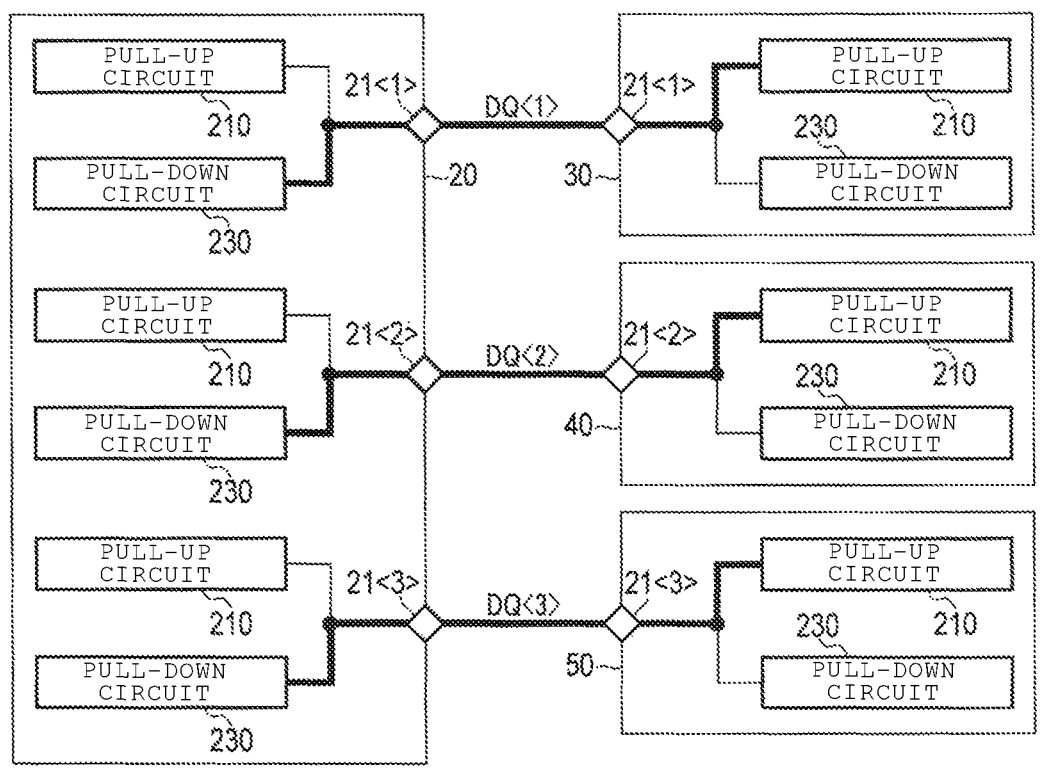
FIG. 13 is a schematic diagram that illustrates the subsequent chip calibration operation on a pull-down side of the semiconductor device, according to the first embodiment.

When the setting example of FIG. 11 is applied, the semiconductor storage devices 20 to 50 have the connection relationship as shown in FIG. 13 when steps ST17 and ST18 of FIG. 10 are performed.

That is, as shown in FIG. 13, in step ST17, in the semiconductor storage device 20 as the reference chip, three pull-up circuits 210 which are connected to the pads 21<1> to 21<3> enter the OFF state, and three pull-down circuits 230 enter the ON state.

In step ST18, in the semiconductor storage devices 30 to 50 which are the calibration chips, the pull-up circuits 210 connected to the pads 21<1> to 21<3> enter the ON state, and the pull-down circuits 230 enter the OFF state.

Both in steps ST16 and ST18, in the semiconductor storage device 30, both the pull-up circuit 210 and the pull-down circuit 230 connected to the pads 21<2> and 21<3> enter the OFF state. In the semiconductor storage device 40, both the pull-up circuit 210 and the pull-down circuit 230 connected to the pads 21<1> and 21<3> enter the OFF state. In the semiconductor storage device 50, both the pull-up circuit 210 and the pull-down circuit 230 connected to the pads 21<1> and 21<2> enter the OFF state.

By performing the operation as described above, in the subsequent chip calibration operation, the semiconductor storage device 30 is electrically connected to only the semiconductor storage device 20 via the signal line through which the signal DQ<1> is communicated. The semiconductor storage device 40 is electrically connected to only the semiconductor storage device 20 via the signal line through which the signal DQ<2> is communicated. The semiconductor storage device 50 is electrically connected to only the semiconductor storage device 20 via the signal line through which the signal DQ<3> is communicated.

1.3 Advantages According to Present Embodiment

When the semiconductor storage device and the memory controller communicate with each other, it is necessary to perform the ZQ calibration operation so as to cause the signal to be used in the communication to have the proper signal levels. Through the ZQ calibration operation, the output impedance of the semiconductor storage device is calibrated by using the replica buffer circuit having the configuration equivalent to that of the output buffer circuit and the high-precision reference resistor. However, in general, the replica buffer circuit has driving capability lower than that of the output buffer circuit. In general, only one reference resistor is provided for the plurality of chips connected to one memory controller. In this case, it is necessary to perform the ZQ calibration operation for each chip.

According to the semiconductor device according to the first embodiment, the output impedances of the semiconductor storage devices 30 to 50 are calibrated based on the output impedance of the semiconductor storage device 20. Specifically, in the subsequent chip calibration operation, the calibration operation is performed on the pull-up circuit 210 and the pull-down circuit 230 which have the driving capability higher than those of the first replica buffer circuit 102 and the third replica buffer circuit 104 within each calibration chip. Thus, a time necessary to perform the calibration operation of one certain chip in the subsequent chip calibration operation can be further shortened than that in the ZQ calibration operation.

According to a first aspect of the first embodiment, different signal lines are assigned to the plurality of calibration chips, as the signal lines electrically connected to the reference chip when the subsequent chip calibration operation is performed. Thus, a plurality of subsequent chip calibration operation may be performed in parallel. Accordingly, a time necessary to perform the calibration operation can be further shortened than that when the calibration operation is performed on each chip.

According to a second aspect of the first embodiment, the subsequent chip calibration operation includes the subsequent chip calibration operation on the pull-up circuit 210 and the subsequent chip calibration operation on the pull-down circuit 230. In the subsequent chip calibration operation on the pull-up circuit 210, the pull-down circuit 230 of the reference chip and the pull-up circuit 210 of the calibration chip are electrically connected. In the subsequent chip calibration operation on the pull-down circuit 230, the pull-up circuit 210 of the reference chip and the pull-down circuit 230 of the calibration chip are electrically connected. Thus, it is possible to calibrate the output impedances of the pull-up circuit 210 and the pull-down circuit 230 of the calibration chips based on the output impedances of the pull-down circuit 230 and the pull-up circuit 210 of the reference chip.

According to a third aspect of the first embodiment, the subsequent chip calibration operation is performed using the third comparator 251, the first output buffer controller 107, the second output buffer controller 108, the pull-up circuit 210, and the pull-down circuit 230. Therefore, it is possible to perform the subsequent chip calibration operation without adding a new circuit.

According to a fourth aspect of the first embodiment, each of the semiconductor storage devices 20 to 50 designates the reference chip of the subsequent chip calibration operation based on the command "XXh" and the address ADD2 to be described below. Accordingly, the semiconductor storage devices 20 to 50 can determine whether or not the semiconductor storage device is the reference chip or the calibration chip by themselves. Therefore, it is possible to perform the subsequent chip calibration operation using the plurality of calibration chips without interfering each other.

According to a fifth aspect of the first embodiment, the subsequent chip calibration operation is performed after the ZQ calibration operation on the reference chip is performed. Accordingly, it is possible to calibrate the calibration chip based on the output impedance of the reference chip calibrated by the reference resistor. Thus, the subsequent chip calibration operation can achieve precision equivalent to that of the calibration result of the ZQ calibration operation.

2. Second Embodiment

Hereinafter, a semiconductor device according to a second embodiment will be described. The semiconductor device according to the second embodiment is different from the semiconductor device according to the first embodiment in that the calibration chip does not perform the calibration operation on its own output buffer circuit or the replica buffer circuit. That is, the calibration chip of the semiconductor device according to the second embodiment receives the calibration result information acquired by the ZQ calibration operation of the reference chip, and sets the received calibration result information as the calibration result information for its chip.

The semiconductor device according to the second embodiment has the same configuration as that of the semiconductor device according to the first embodiment. Hereinafter, the same components as those of the first embodiment will be assigned the same reference numerals, and the description thereof will be omitted. Only portions different from those of the first embodiment will be described.

2.1 Outline of Calibration Operation

Figure 14:
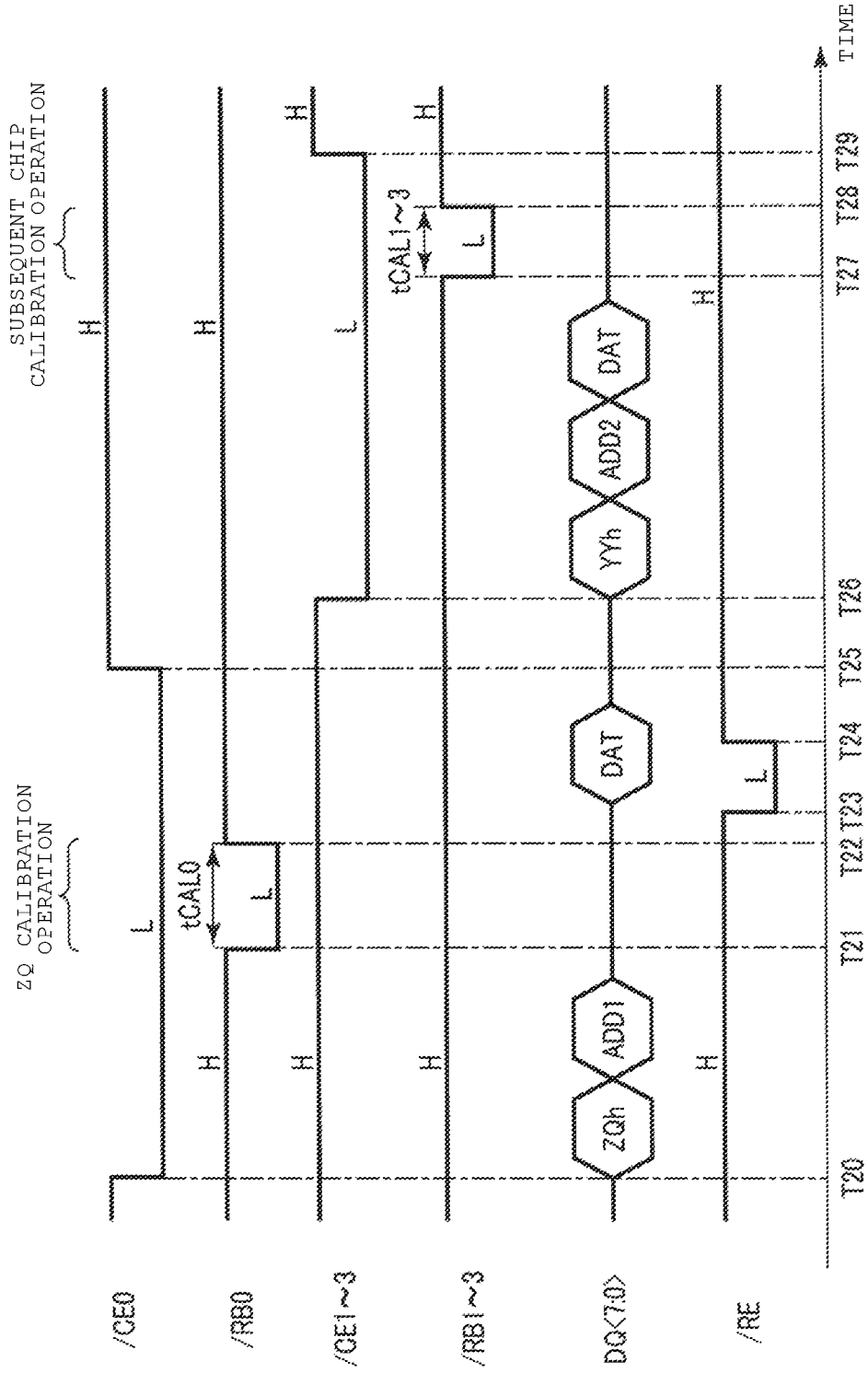
FIG. 14 is a timing chart for describing a ZQ calibration operation and a subsequent chip calibration operation of a semiconductor device, according to a second embodiment.

The outline of the calibration operation according to the second embodiment will be described using a timing chart shown in FIG. 14. As shown in FIG. 14, the calibration operation according to the second embodiment includes the same ZQ calibration operation as that in the first embodiment and a subsequent chip calibration operation different from that in the first embodiment.

Initially, the controller 10 causes the semiconductor storage device 20 to perform the ZQ calibration operation at times T20 to T22. As described above, the ZQ calibration operation at the times T20 to T22 is the same ZQ calibration operation at the times T0 to T2 shown in FIG. 9 of the first embodiment, and thus, the description thereof is omitted here.

Subsequently, at a time T23, the controller 10 sets the signal /RE to be at the "L" level, and instructs the semiconductor storage device 20 to start to output data DAT. Accordingly, the semiconductor storage device 20 sends the data DAT to the controller 10. The data DAT includes the calibration result information acquired by the ZQ calibration operation.

At a time T24, the controller 10 sets the signal /RE to be at the "H" level, and instructs the semiconductor storage device to end the outputting of the data DAT.

At a time T25, the controller 10 sets the signal /CE0 to be at the "H" level, and disables the semiconductor storage device 20.

Subsequently, the controller 10 performs the semiconductor storage devices 30 to 50 to perform the subsequent chip calibration operation with the semiconductor storage device 20. Specifically, at the time T25, the controller 10 sets the signals /CE1 to /CE3 to be at the "L" level, and enables the semiconductor storage devices 30 to 50. Subsequently, the controller 10 issues the command "YYh", and transmits the issued command to the semiconductor storage devices 20 to 50. The command "YYh" is a command to perform the subsequent chip calibration operation using the calibration result information of the reference chip.

For example, the controller 10 issues the address ADD2 over one cycle, and transmits the issued address to the semiconductor storage devices 30 to 50. Accordingly, the semiconductor storage devices 30 to 50 recognize themselves as the calibration chips. Subsequently, the controller 10 sends the data DAT including the calibration result information to the semiconductor storage devices 30 to 50.

When the "subsequent chip calibration command" including the command "YYh", the address ADD2, and the data DAT, is stored in the registers of the semiconductor storage devices 30 to 50, each of the semiconductor storage devices 30 to 50 controls the interface circuit 23 and the ZQ calibration circuit 24, and starts the subsequent chip calibration operation.

At a time T27, the semiconductor storage devices 30 to 50 set the signals /RB1 to /RB3 to be at the level "L", and notify the controller 10 that the semiconductor storage devices 30 to 50 are in the busy state. In the example of FIG. 14, all periods tCAL1-3 are included in a period from the time T27 to a time T28. After the subsequent chip calibration operation is ended, the semiconductor storage devices 30 to 50 set the signals /RB1 to /RB3 to be at the "H" level and notify the controller 10 that the semiconductor storage devices 30 to 50 are in the ready state at the time T28.

At a time T29, the controller 10 sets the signals /CE0 to /CE3 to be at the "H" level, and disables the semiconductor storage devices 30 to 50.

With this, the ZQ calibration operation and the subsequent chip calibration operation are ended.

2.2 Details of Calibration Operation

Figure 15:
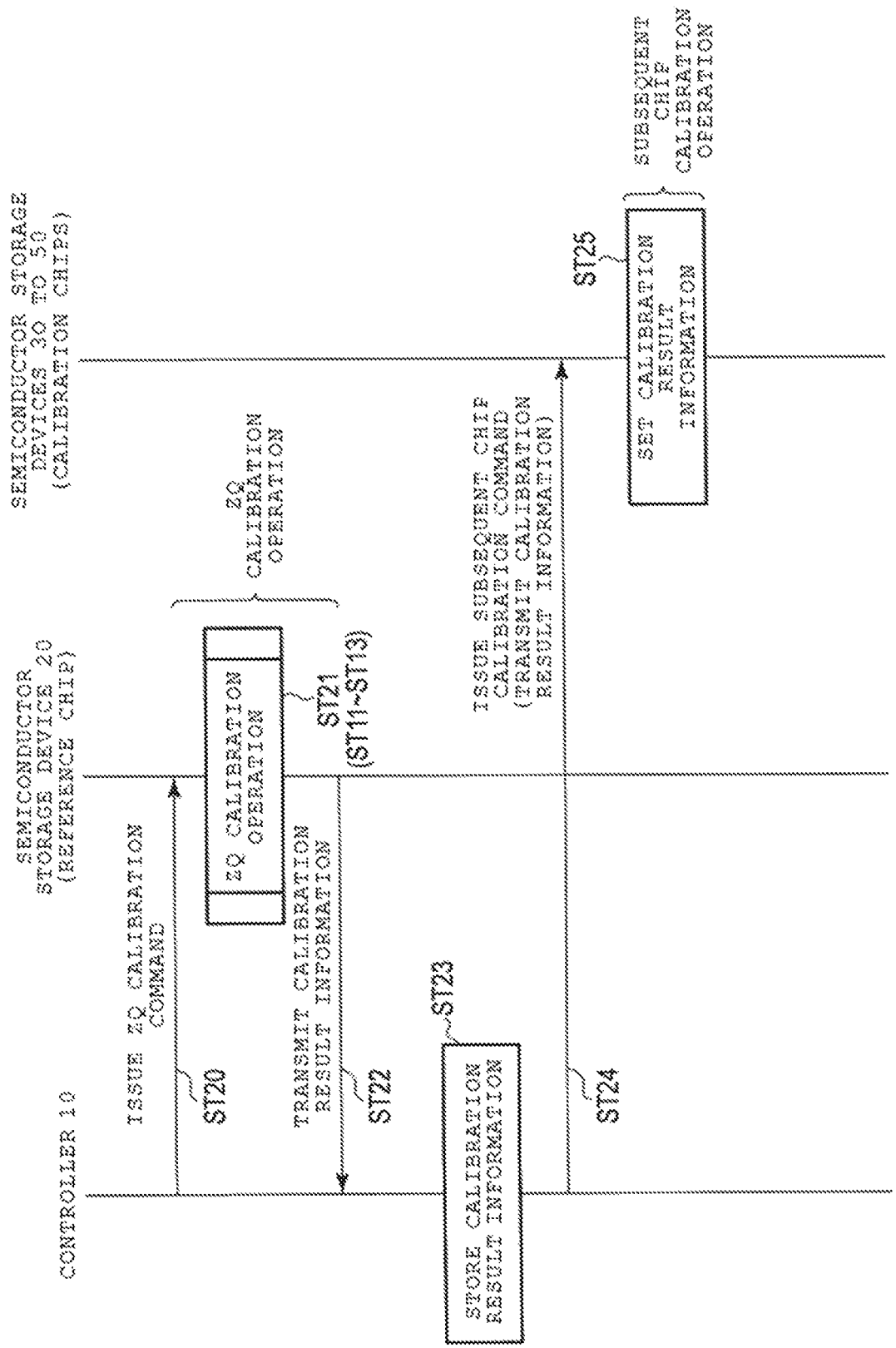
FIG. 15 is a flowchart for describing the ZQ calibration operation and the subsequent chip calibration operation of the semiconductor device, according to the second embodiment.

Hereinafter, the details of the calibration operation of the semiconductor device according to the second embodiment will be described with reference to a flowchart shown in FIG. 15. In FIG. 15, the ZQ calibration operation of the semiconductor storage device 20 (the reference chip) and the subsequent chip calibration operation of the reference chip and the semiconductor storage devices 30 to 50 (the plurality of calibration chips) are illustrated.

As shown in FIG. 15, in step ST20, the controller 10 issues the ZQ calibration command to the reference chip.

In step ST21, the reference chip performs the ZQ calibration operation. The operation equivalent to those of step ST11 to ST13 shown in FIG. 10 of the first embodiment is performed in step ST21. The reference chip generates the calibration result information items based on the calibration results acquired by the ZQ calibration operations on the pull-up side and the pull-down side. For example, the calibration result information items are stored within the first output buffer controller 107 and the second output buffer controller 108 as shift amounts (for example, +2) of the DAC value before the calibration and after the calibration.

In step ST22, the reference chip sends the calibration result information items generated by the ZQ calibration operation to the controller 10.

In step ST23, the controller 10 stores the received calibration result information items in the buffer memory 14.

In step ST24, the controller 10 issues the subsequent chip calibration command to each calibration chip. As stated above, the issuance of the subsequent chip calibration command includes the sending of the calibration result information of the reference chip.

In step ST25, each calibration chip sets the received calibration result information items for its first output buffer controller 107 and second output buffer controller 108. Accordingly, the first output buffer controller 107 of the calibration chip changes the impedance control signal PCODEB<4:0> by the shift amount of the DAC value on the pull-up side which is included in the calibration result information. The second output buffer controller 108 of each calibration chip changes the impedance control signal NCODEB<4:0> by the shift amount of the DAC value on the pull-down side which is included in the calibration result information.

2.3 Advantages According to Present Embodiment

According to the semiconductor device according to the second embodiment, the calibration chip receives the calibration result information of the reference chip from the controller 10, and sets the calibration result information for its own chip. Accordingly, the calibration chip can acquire the calibration result information without performing the calibration operation using the circuit within its chip. Thus, it is possible to complete the calibration within a time shorter than that in the subsequent chip calibration operation of the first embodiment. Therefore, it is possible to further shorten the time necessary in the calibration operation.

In the subsequent chip calibration operation according to the second embodiment, it is necessary to newly perform an operation of sending the calibration result information of the reference chip to the controller 10. However, a time (a period from the time T23 to the time T24 shown in FIG. 14) necessary in the operation is shorter than a time necessary to stabilization of the voltage with the calibration operation. Thus, it is possible to complete the calibration in the second embodiment within a time shorter than in the first embodiment.

According to a first aspect of the second embodiment, the calibration result information includes the shift amounts of the DAC value before the calibration of the reference chip and after the calibration. Accordingly, the calibration chip can apply a change in setting value acquired by the reference chip that performs the ZQ calibration operation for its chip. Thus, when initial setting values of the reference chip and the calibration chip are the same, the setting values of the respective chips after the calibration can match each other. For example, the reference chip and the calibration chip are exposed to the substantially same environment change (for example, change in temperature), and thus, such a calibration operation is particularly useful when equivalent changes are caused in the output impedances of the reference chip and the calibration chip.

3. Modification Examples

The embodiments are not limited to the aspects mentioned in the first embodiment and the second embodiment, and may be modified various ways.

For example, although it has been described in the first embodiment that the subsequent chip calibration operation with the reference chip is performed on the plurality of calibration chips in parallel, embodiments of the present disclosure are not limited thereto. For example, the subsequent chip calibration operations may be carried out at different time periods so that they do not interfere each other. Such a modification example will be described with reference to FIG. 16.

As shown in FIG. 16, since the operation performed from a time T0 to a time T3 is equivalent to the operation from the time T0 to the time T3 shown in FIG. 9 of the first embodiment, the description thereof will be omitted.

At a time T4, the semiconductor storage device 30 sets the signal /RB1 to be at the "L" level, and notifies the controller 10 that the semiconductor storage device 30 is in the busy state. A period tCAL1 is included in a period from the time T4 to a time T5. After the subsequent chip calibration operation between the semiconductor storage device 30 and the semiconductor storage device 20 is ended, the semiconductor storage device 30 sets the signal /RB1 to be at the "H" level and notifies the controller 10 that the semiconductor storage device 30 is the ready state at the time T5.

At a time T6, the semiconductor storage device 40 sets the signal /RB2 to be at the "L" level, and notifies the controller 10 that the semiconductor storage device 40 is in the busy state. A period tCAL2 is included in a period from a time T6 to a time T7. After the subsequent chip calibration operation between the semiconductor storage device 40 and the semiconductor storage device 20 is ended, the semiconductor storage device 40 sets the signal /RB2 to be at the "H" level and notifies the controller 10 that the semiconductor storage device 40 is in the ready state at the time T7.

At a time T8, the semiconductor storage device 50 sets the signal /RB3 to be at the "L" level and notifies the controller 10 that the semiconductor storage device 50 is in the busy state. A time tCAL3 is included in a period from the time T8 to a time T9. After the subsequent chip calibration operation between the semiconductor storage device 50 and the semiconductor storage device 20 is ended, the semiconductor storage device 50 sets the signal /RB3 to be at the "H" level and notifies the controller 10 that the semiconductor storage device 50 is in the ready state at the time T9.

At a time T10, the controller 10 sets the signals /CE0 to /CE3 to be at the "H" level and disables the semiconductor storage devices 20 to 50.

By performing the operation as stated above, it is possible to distribute a load simultaneously applied to the reference chip during the subsequent chip calibration operations. Thus, even when the reference chip is operated with a voltage power lower than that in the first embodiment, the subsequent chip calibration operation can be performed. As mentioned above, the subsequent chip calibration operation can be performed within a time shorter than that in the ZQ calibration operation. Thus, the modification example has an advantage of reducing the time necessary in the calibration operation than that in the related art in which the ZQ calibration operation is applied to all the chips.

Although it has been described that the memory system 1 according to the first embodiment and the second embodiment is provided within one package, the exemplary embodiment of the present disclosure is not limited thereto. For example, the memory system 1 may be configured such that the controller 10 and the plurality of semiconductor storage devices 20 to 50 are respectively provided within separate packages. The reference resistor 2 may be attached from the outside of the package.

In addition, the following matters may be applied in each embodiment and each modification example.

In a multi-level read operation (read), a voltage applied to a word line selected in an A-level read operation is in a range of, for example, 0 V to 0.55 V. The exemplary embodiment of the present disclosure is not limited to this example, and this voltage may be in any one range of 0.1 V to 0.24 V, 0.21 V to 0.31 V, 0.31 V to 0.4 V, 0.4 V to 0.5 V, and 0.5V to 0.55 V.

A voltage applied to a word line selected in a B-level read operation is in a range of, for example, 1.5 V to 2.3 V. The exemplary embodiment of the present disclosure is not limited to this example, and this voltage may be in any one range of 1.75 V to 1.8 V, 1.8 V to 1.95 V, 1.95 V to 2.1 V, and 2.1 V to 2.3 V.

A voltage applied to a word line selected in a C-level read operation is in a range of, for example, 3.0 V to 4.0 V. The exemplary embodiment of the present disclosure is not limited to this example, and this voltage may be in any one range of 3.0 V to 3.2 V, 3.2 V to 3.4 V, 3.4 V to 3.5 V, 3.5 V to 3.7 V, and 3.7 V to 4.0 V.

For example, a read operation time (tR) may be in any one range of 25 µs to 38 µs, 38 µs to 70 µs, and 70 µs to 80 µs.

The write operation includes a program operation and a verification operation. In the write operation, a voltage initially applied to a word line selected at the time of the program operation is in a range of, for example, 13.7 V to 14.3 V. The exemplary embodiment of the present disclosure is not limited to this example, and for example, this voltage may be in any one range of 13.7 V to 14.0 V, and 14.0 V to 14.7 V.

A voltage initially applied to a selected word line when data is written in an odd-numbered word line and a voltage initially applied to a selected word line when data is written in an even-numbered word line may be changed.

When the program operation is performed by an incremental step pulse program (ISPP) method, a step-up voltage may be, for example, about 0.5 V.

A voltage applied to a non-selected word line may be in a range of, for example, 7.0 V to 7.3 V. The exemplary embodiment of the present disclosure is not limited to this example, and for example, this voltage may be in a range of 7.3 V to 8.4 V or may be 7.0 V or less.

A path voltage to be applied may be changed depending on whether the non-selected word line is the odd-numbered word line or the even-numbered word line.

For example, a write operation time (tProg) may be in any one range of 1700 µs to 1800 µs, 1800 µs to 1900 µs, and 1900 µs to 2000 µs.

In an erasing operation, a voltage initially applied to a well which is formed on a semiconductor substrate and above which a memory cell is disposed is in a range of, for example, 12 V to 13.7 V. The exemplary embodiment of the present disclosure is not limited to this example, and for example, this voltage may be in any one range of 13.7 V to 14.8 V, 14.8 V to 19.0 V, 19.0 V to 19.8 V, and 19.8 V to 21 V.

For example, an erasing operation time (tErase) may be in any one range of 3000 µs to 4000 µs, 4000 µs to 5000 µs, and 4000 µs to 9000 µs.

The memory cell includes a charge storage layer disposed on the semiconductor substrate (silicon substrate) via a tunnel insulating film having a film thickness of 4 nm to 10 nm. The charge storage layer may have a stacked structure of an insulating film such as SiN or SiON having a film thickness of 2 nm to 3 nm and polysilicon having a thickness of 3 nm to 8 nm. Metal such as Ru may be added to the polysilicon. The insulating film is formed on the charge storage layer. For example, the insulating film includes a silicon oxide film having a film thickness of 4 to 10 nm sandwiched between a lower high-k film having a thickness of 3 to 10 nm and an upper high-k film having a thickness of 3 nm to 10 nm. HfO is use as the high-k film. The film thickness of the silicon oxide film may be greater than the film thickness of the high-k film. A control electrode having a film thickness of 30 nm to 70 nm is formed on the insulating film via a material having a film thickness of 3 nm to 10 nm. Here, such a material is a metal oxide film such as TaO or a metal nitride film such as TaN. W may be used as the control electrode.

An air gap may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device configured to communicate with a controller, the semiconductor device comprising:
    a first chip that includes a first circuit having a first output terminal; and a second chip that includes a second circuit having a second output terminal, which is electrically connected to the first output terminal via a first signal line, wherein upon receipt of a first command, the first circuit calibrates an output impedance at the first output terminal through a first calibration operation, and the first circuit issues a signal indicating that the first chip is in a ready state during the first calibration operation, upon receipt of a second command after the first calibration operation is performed, the second circuit calibrates an output impedance at the second output terminal through a second calibration operation based on the output impedance at the first output terminal, and a duration of the second calibration operation is shorter than a duration of the first calibration operation.

2. A semiconductor device configured to communicate with a controller, the semiconductor device comprising:

a first chip that includes a first circuit having a first output terminal; and a second chip that includes a second circuit having a second output terminal, which is electrically connected to the first output terminal via a first signal line, wherein the first chip:
upon receipt of a first command, calibrates an output impedance at the first output terminal through a first calibration operation,
transmits to the controller a signal indicating that the first chip is in a busy state upon starting the first calibration operation, and
transmits to the controller a signal indicating that the first chip is in a ready state upon completion of the first calibration operation, the second chip:
upon receipt of a second command after the first calibration operation is performed, calibrates an output impedance at the second output terminal through a second calibration operation based on the output impedance at the first output terminal,
transmits to the controller a signal indicating that the second chip is in the busy state upon starting the second calibration operation, and
transmits to the controller a signal indicating that the second chip is in the ready state upon completion of the second calibration operation, and a duration of the second calibration operation is shorter than a duration of the first calibration operation.

3. A semiconductor device configured to communicate with a controller, the semiconductor device comprising:

a first chip that includes a first circuit including a first output terminal; and a second chip that includes a second circuit including a second output terminal, which is electrically connected to the first output terminal via a first signal line, wherein upon receipt of a first command, the first circuit calibrates an output impedance at the first output terminal through a first calibration operation, upon receipt of a second command after the first calibration operation is performed, the second circuit calibrates an output impedance at the second output terminal through a second calibration operation based on the output impedance at the first output terminal, a duration of the second calibration operation is shorter than a duration of the first calibration operation, the first circuit further includes:

a first pull-up circuit having a first terminal to which a first voltage is supplied, and a second terminal electrically connected to the first output terminal, and a first pull-down circuit having a first terminal to which a second voltage smaller than the first voltage is supplied and a second terminal electrically connected to the first output terminal, the second circuit further includes:

a second pull-up circuit having a first terminal to which the first voltage is supplied, and a second terminal electrically connected to the second output terminal, a second pull-down circuit having a first terminal to which the second voltage is supplied, and a second terminal electrically connected to the second output terminal, and a comparator having a first terminal to which a voltage of the second output terminal is supplied and a second terminal to which a third voltage between the first voltage and the second voltage is supplied, and the second calibration operation includes:

a first operation during which the first pull-up circuit and the second pull-down circuit enter an ON state while the first pull-down circuit and the second pull-up circuit enter an OFF state, and a second operation during which the second pull-up circuit and the first pull-down circuit enter an ON state while the second pull-down circuit and the first pull-up circuit enter an OFF state.

4. The semiconductor device according to claim 3, wherein during the first operation, the second circuit calibrates a resistance value of the second pull-down circuit based on a comparison result of the comparator that compares the voltage of the second output terminal with the third voltage.

5. The semiconductor device according to claim 3, wherein during the second operation, the second circuit calibrates a resistance value of the second pull-up circuit based on a comparison result of the comparator that compares the voltage of the second output terminal with the third voltage.

6. The semiconductor device according to claim 3, wherein the second pull-up circuit includes first and second transistors which are connected in parallel between a voltage supply supplying the first voltage and the second output terminal, and the first and second transistors have different resistance values in an ON state.

7. The semiconductor device according to claim 3, wherein the second pull-down circuit includes third and fourth transistors which are connected in parallel between a voltage supply supplying the second voltage and the second output terminal, and the third and fourth transistors have different resistance values in an ON state.

8. The semiconductor device according to claim 1, further comprising:

a third chip that includes a third circuit having a third output terminal, which is electrically connected to a fourth output terminal of the first chip via a second signal line, wherein upon receipt of a third command after the first calibration operation is performed, the third circuit calibrates an output impedance at the third output terminal through a third calibration operation based on an output impedance at the fourth output terminal.

9. The semiconductor device according to claim 8, wherein
the second and third calibration operations are performed in parallel.

10. The semiconductor device according to claim 8, wherein
the second and third calibration operations are performed in series.

11. The semiconductor device according to claim 1, wherein
the second command includes address information that identifies the first chip.

12. The semiconductor device according to claim 1, wherein
the first chip generates calibration result information based on a calibration result of the first calibration operation, and
the second calibration operation includes adjusting the output impedance of the second output terminal based on the calibration result information.

13. The semiconductor device according to claim 12, wherein
the first circuit includes:
a first pull-up circuit having a first terminal to which a first voltage is supplied, and a second terminal electrically connected to the first output terminal, and
a first pull-down circuit having a first terminal to which a second voltage smaller than the first voltage is supplied and a second terminal electrically connected to the first output terminal, and
the calibration result information includes:
a first information corresponding to a resistance value of the first pull-up circuit, and
a second information corresponding to a resistance value of the first pull-down circuit.

14. The semiconductor device according to claim 13, wherein
the second circuit includes:
a second pull-up circuit having a first terminal to which the first voltage is supplied, and a second terminal electrically connected to the second output terminal, and
a second pull-down circuit having a first terminal to which the second voltage is supplied, and a second terminal electrically connected to the second output terminal, and
a resistance value of the second pull-up circuit is set based on the first information, and a resistance value of the second pull-down circuit is set based on the second information.

15. The semiconductor device according to claim 14, wherein
the first and second information each include a digital-to-analog converter (DAC) value.

16. The semiconductor device according to claim 1, wherein
after the first command is received, the first calibration operation is carried out without any control from the controller.

17. A memory system comprising:
a semiconductor device including:
a first chip that includes a first circuit having a first output terminal, and
a second chip that includes a second circuit having a second output terminal, which is electrically connected to the first output terminal via a first signal line; and
a controller electrically connected to the first and second chips via the first signal line and configured to issue a first command and a second command after the first command, wherein
upon receipt of the first command, the first circuit calibrates an output impedance at the first output terminal through a first calibration operation, and the first chip generates calibration result information based on a calibration result of the first calibration operation and transmits the generated calibration result information to the controller,
upon receipt of the second command, the second circuit calibrates an output impedance at the second output terminal through a second calibration operation based on the output impedance at the first output terminal, the second calibration operation including adjusting the output impedance of the second output terminal based on the calibration result information received from the controller, and
a duration of the second calibration operation is shorter than a duration of the first calibration operation.

18. The memory system according to claim 17, wherein
the semiconductor device further includes a third chip having a third circuit having a third output terminal, which is electrically connected to a fourth output terminal of the first chip via a second signal line,
the controller is further configured to issue a third command after the first command, and
upon receipt of the third command, the third circuit calibrates an output impedance at the third output terminal through a third calibration operation based on an output impedance at the fourth output terminal.

* * * * *